United States Patent
Oshida

(10) Patent No.: US 8,174,011 B2
(45) Date of Patent: May 8, 2012

(54) POSITIONAL OFFSET MEASUREMENT PATTERN UNIT FEATURING VIA-PLUG AND INTERCONNECTIONS, AND METHOD USING SUCH POSITIONAL OFFSET MEASUREMENT PATTERN UNIT

(75) Inventor: Daisuke Oshida, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 603 days.

(21) Appl. No.: 12/018,256

(22) Filed: Jan. 23, 2008

(65) Prior Publication Data
US 2008/0217613 A1    Sep. 11, 2008

(30) Foreign Application Priority Data
Mar. 7, 2007 (JP) ................................. 2007-057780

(51) Int. Cl.
| H01L 23/58 | (2006.01) |
| H01L 29/10 | (2006.01) |
| H01L 23/48 | (2006.01) |
| H01L 23/52 | (2006.01) |
| H01L 29/40 | (2006.01) |

(52) U.S. Cl. .......... 257/48; 257/750; 257/758; 257/773; 257/774; 257/775; 257/E23.011; 257/E23.145

(58) Field of Classification Search .................. 257/48, 257/774, 758, 750, 773, 775, E23.011, E23.145
See application file for complete search history.

(56) References Cited

U.S. PATENT DOCUMENTS

| 5,846,876 A * | 12/1998 | Bandyopadhyay et al. .. 438/622 |
| 6,388,332 B1 * | 5/2002 | Aggarwal et al. ............. 257/774 |
| 6,717,267 B1 * | 4/2004 | Kunikiyo ...................... 257/758 |
| 7,042,095 B2 * | 5/2006 | Noguchi et al. ............... 257/762 |
| 7,075,182 B2 * | 7/2006 | Mitani et al. .................. 257/758 |
| 2001/0017418 A1 * | 8/2001 | Noguchi et al. ............... 257/758 |
| 2002/0119651 A1 * | 8/2002 | Noguchi et al. ............... 438/618 |
| 2003/0020168 A1 * | 1/2003 | Watanabe et al. ............. 257/760 |
| 2003/0034558 A1 * | 2/2003 | Umemura et al. ............ 257/734 |
| 2004/0222528 A1 * | 11/2004 | Kunikiyo ...................... 257/758 |
| 2006/0091549 A1 * | 5/2006 | Kojima ......................... 257/758 |
| 2007/0018330 A1 * | 1/2007 | Takeda et al. ................. 257/762 |

FOREIGN PATENT DOCUMENTS
JP    10-50703    2/1998

* cited by examiner

*Primary Examiner* — Teresa M Arroyo
(74) *Attorney, Agent, or Firm* — Young & Thompson

(57) ABSTRACT

In a positional offset measurement pattern unit formed in an insulating layer, a first interconnection is formed in the insulating layer. A via-plug is formed in the insulating layer so as to be electrically connected to the first interconnection. A second interconnection is formed in the insulating layer at substantially the same level as the first interconnection so as to be spaced from the first interconnection by a given distance. A voltage is applied between the first and second interconnections to measure a relative positional offset amount between the via-plug and the second interconnection.

16 Claims, 20 Drawing Sheets

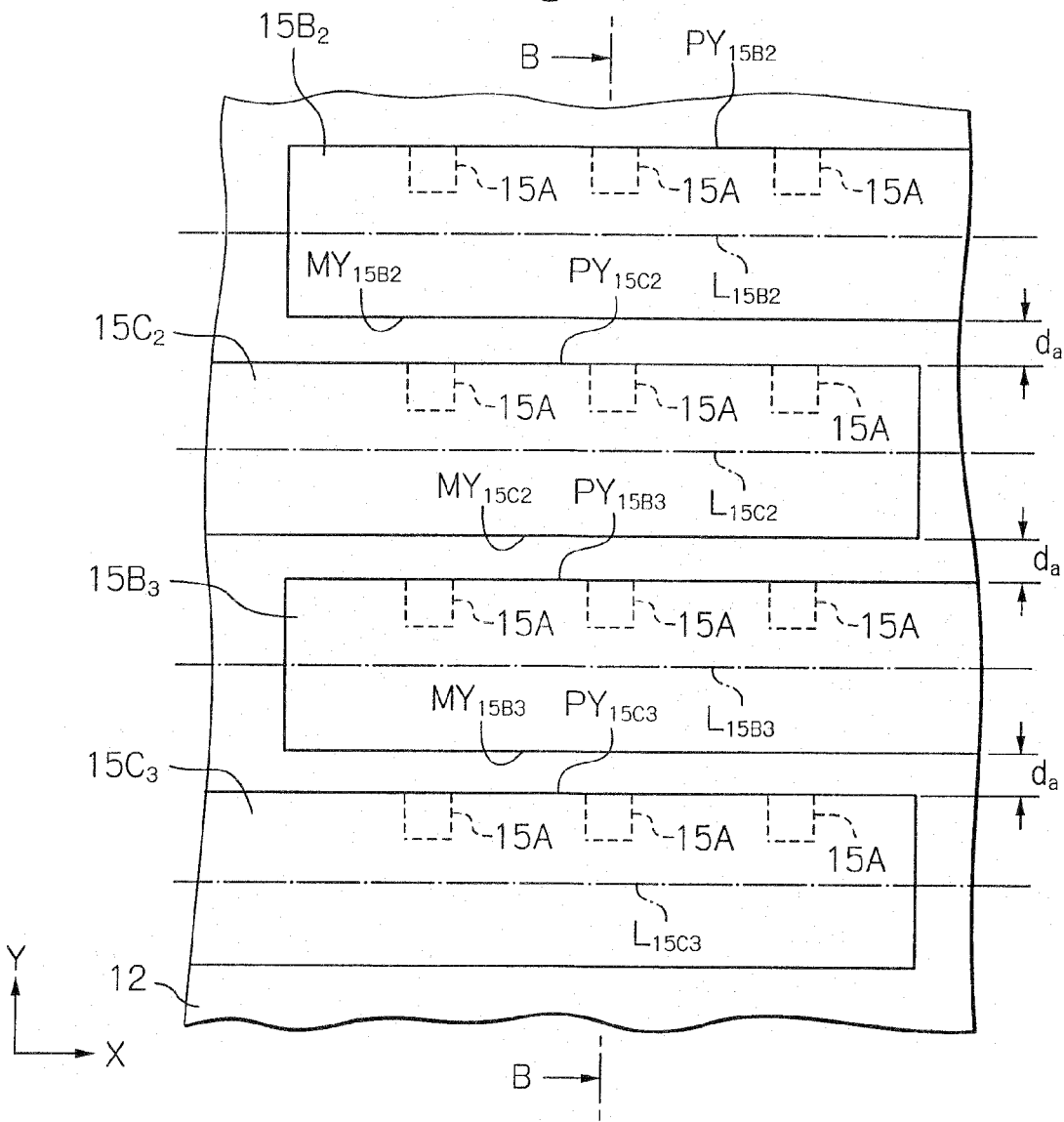
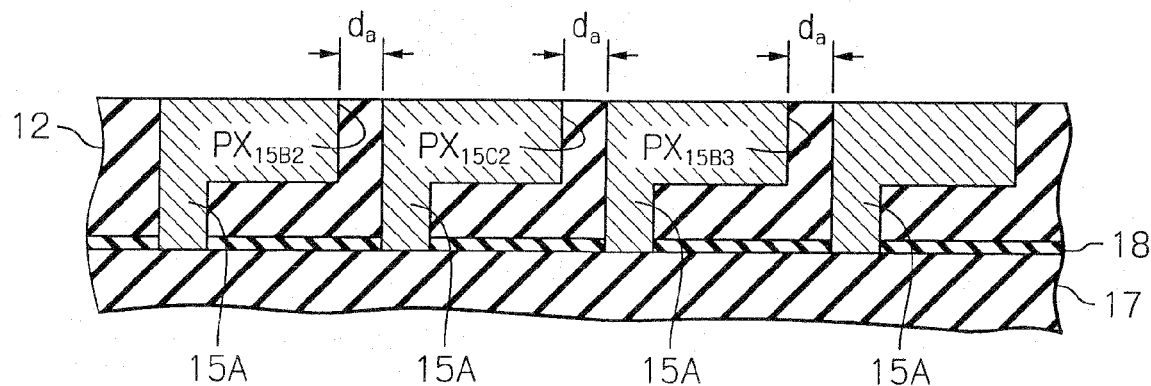

POSITIONAL OFFSET MEASUREMENT PATTERN UNIT FEATURING VIA-PLUG AND INTERCONNECTIONS, AND METHOD USING SUCH POSITIONAL OFFSET MEASUREMENT PATTERN UNIT

BACKGROUND OF THE INVENTION

1. Field of the Invention

The present invention relates to a positional offset measurement pattern unit for measuring a positional offset between a plurality of via-plugs and a plurality of interconnections formed in an insulating interlayer of a multi-layered wiring structure, a semiconductor device featuring such a positional offset measurement pattern unit and a positional offset measurement method which is carried out by using such a positional offset measurement pattern unit.

2. Description of the Related Art

In a process of manufacture of semiconductor devices, various electronic elements, such as transistors, resistors, capacitors and so on, are produced in a semiconductor substrate, and then a multi-layered wiring structure is constructed on the semiconductor substrate.

For example, the construction of the multi-layered wiring structure can be carried out by using a dual-damascene process. In this case, the multi-layered wiring structure includes a plurality of insulating interlayers stacked in order, and each of the insulating interlayer has a plurality of via-plugs and a plurality of interconnections formed therein, with each of the via-plugs being suitably connected to any one of the interconnections.

In particular, in the dual-damascene process, in order to form the via-plugs, a plurality of via-holes are formed in the insulating interlayer by an anisotropic etching process or dry etching process using a photoresist pattern layer having a plurality of openings corresponding to the via-holes. Then, in order to form the interconnections) a plurality of trenches are formed in the insulating interlayer by an anisotropic etching process or dry etching process using a photoresist pattern layer having a plurality of openings corresponding to the trenches. Subsequently, the via-holes and the trenches are stuffed with a suitable metal material by an electroplating process, resulting in the formation of the via-plugs and the interconnections. Namely, the via-plugs are formed by stuffing the via-holes with the metal material, and the interconnections are formed by stuffing the trenches with the metal material.

The photoresist pattern layer for forming the via-holes is formed on the insulating interlayer by a photolithography process using a photomask. After the formation of the via-holes is completed, the photoresist pattern is removed from the insulating interlayer. Then, the photoresist pattern layer for forming the trenches is formed on the insulating interlayer by a photolithography process using a photomask.

Note, in the above-mentioned dual-damascene process, although the formation of the via-holes is carried out prior to the formation of the trenches, the formation of the trenches may be carried out prior to the formation of the via-holes.

In either event, before the via-plugs and the interconnections can be properly arranged with respect to each other, the photomask used to form the via-holes and the photomask used to form the trenches have to be individually and correctly positioned with respect to the semiconductor substrate. Nevertheless, one or two of the photomasks may be erroneously positioned with respect to the semiconductor substrate, so that the arrangement of the via-plugs and the arrangement of the interconnections may be relatively offset from each other.

When the arrangement of the via-plugs and the arrangement of the interconnections may be relatively offset from each other, a part of the via-plugs may become abnormally close to a part of the interconnections. When a distance between a via-plug and an interconnection is too small, a breakdown may occur between the via-plug and the interconnection, resulting in leakage of current therebetween.

Accordingly, during the construction of the multi-layered wiring structure, whenever a plurality of via-plugs and a plurality of interconnections are formed in an insulating interlayer, it is desirable to determine whether the via-plugs and the interconnections are correctly arranged with respect to each other, if necessary.

Japanese Laid-Open Patent Publication (KOKAI) No. H10-050703 discloses a prior art positional offset measurement pattern unit including plural sets of metrical via-plugs and metrical interconnections which are simultaneously formed in an insulating interlayer when a plurality of proper via-plugs and a plurality of proper interconnections are formed in the insulating interlayer, for the purpose of measuring a positional offset between the arrangement of the proper via-plugs and the arrangement of the proper interconnections.

In particular, the metrical interconnections are arranged along one direction in parallel to each other at a regular intervals, and the metrical via-plugs are combined with the respective metrical interconnections so that respective distances between opposite ends of the metrical via-plugs and the metrical interconnections gradually and regularly vary along the aforesaid one direction.

When the proper via-plugs are properly arranged with respect to the proper interconnections, the respective distances between the ends of the metrical via-plugs and the metrical interconnections are gradually and regularly decreased from a first outermost set of a metrical via-plug and a metrical interconnection toward a give middle set of a metrical via-plug and a metrical interconnection, with each of the distances being defined as a positive distance. Further, the respective distances between the ends of the metrical via-plugs and metrical interconnections are gradually and regularly decreased from the middle set of the metrical via-plug and the metrical interconnection toward a second outermost set of a metrical via-plug and a metrical interconnection, with each of the distances being defined as a negative distance so that the metrical via-plugs are electrically connected to the respective metrical interconnections.

In short, when the proper via-plugs are correctly arranged with respect to the proper interconnections, the metrical via-plugs are electrically isolated from the respective metrical interconnections in the range from the first outermost set of a metrical via-plug and a metrical interconnection to the middle set of a metrical via-plug and a metrical interconnection, and the metrical via-plugs are electrically connected to the respective metrical interconnections in the range from the middle set of the metrical via-plug and the metrical interconnection to the second outermost set of the metrical via-plug and the metrical interconnection.

On the other hand, when the proper via-plugs are offset from the proper interconnections in the direction perpendicular to the aforesaid direction along which the metrical interconnections are arranged in parallel to each other, either the number of the sets of metrical via-plugs and metrical interconnections electrically connected to each other or the number of the sets of metrical via-plugs and metrical interconnections electrically isolated from each other varies.

Namely, when the proper via-plugs and the proper interconnections are offset from each other so that the metrical via-plugs are shifted toward the metrical interconnections, i.e., so that the metrical via-plugs are positively shifted with respect to the metrical interconnections, the number of the sets of metrical via-plugs and metrical interconnections electrically connected to each other is increased, and the number of the sets of metrical via-plugs and metrical interconnections electrically isolated from each other is correspondingly decreased.

On the contrary, when the proper via-plugs and the proper interconnections are offset from each other so that the metrical via-plugs are apart from the metrical interconnections, i.e., so that the metrical via-plugs are negatively shifted with respect to the metrical interconnections, the number of the sets of metrical via-plugs and metrical interconnections connected to each other is decreased, and the number of the sets of metrical via-plugs and metrical interconnections electrically isolated from each other is correspondingly increased.

Thus, in Japanese Laid-Open Patent Publication (KOKAI) No. H10-050703, by counting either the number of the sets of metrical via-plugs and metrical interconnections electrically isolated from each other or the number of the sets of metrical via-plugs and metrical interconnections electrically connected to each other, it is possible to measure a positional offset between the arrangement of the proper via-plugs and the arrangement of the proper interconnections.

It has now been discovered that the above-mentioned prior art positional offset measurement pattern unit has problems to be solved as mentioned below.

With the recent advance of miniaturization and integration of semiconductor devices, proper via-plugs and proper interconnections to be formed in an insulating interlayer have become increasingly smaller, and thus it is necessary to more precisely and accurately measure a positional offset between the arrangement of the proper via-plugs and the arrangement of the proper interconnections. Nevertheless, the prior art positional offset measurement pattern unit does not achieve a precise and accurate measurement between the proper via-plugs and the proper interconnections, because the number of the sets of metrical via-plugs and metrical interconnections has to be enormously increased before the precise and accurate measurement can be carried out. However, the increase of the number of the sets of metrical via-plugs and metrical interconnections must be suppressed, or else a space for incorporating the positional offset measurement pattern unit in the insulating interlayer becomes much larger.

SUMMARY OF THE INVENTION

In accordance with an aspect of the present invention, there is provided a positional offset measurement pattern unit incorporated in an insulating layer. The positional offset measurement pattern unit includes a first interconnection formed in the insulating layer, at least one via-plug formed in the insulating layer so as to be electrically connected to the first interconnection, and a second interconnection formed in the insulating layer at substantially the same level as the first interconnection so as to be spaced from the first interconnection by a predetermined distance. A voltage is applied between the first and second interconnections to measure a relative positional offset amount between the via-plug and the second interconnection.

BRIEF DESCRIPTION OF THE DRAWINGS

The present invention will be more clearly understood from the description set forth below, with reference to the accompanying drawings, wherein:

FIG. 9A is a partially-enlarged plan view showing yet another one of the four positional offset measurement pattern units of FIG. 3;

FIG. 9B is a cross-sectional view taken along the B-B line of FIG. 9A;

DESCRIPTION OF THE PREFERRED EMBODIMENTS

Before the description of embodiments of the present invention, for better understanding of the present invention, with reference to FIGS. 1A and 1G, a dual-damascene process for constructing a multi-layered wiring structure on a semiconductor substrate will now be described below.

Figure 1A:
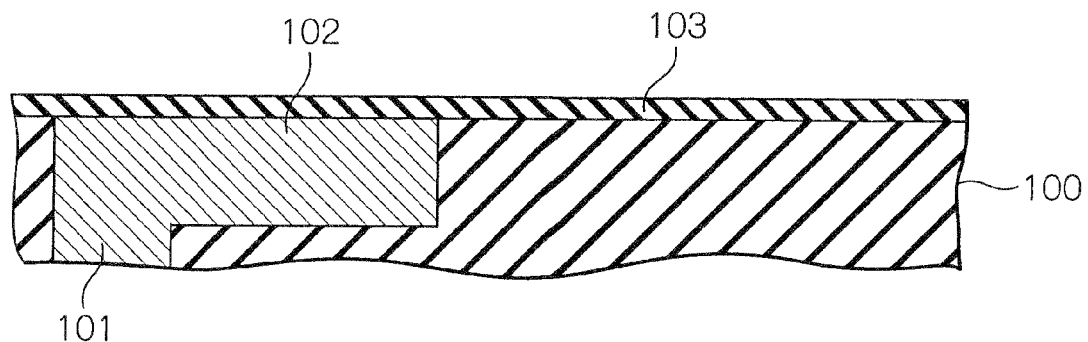
FIGS. 1A through 1G are partial cross-sectional views of a multi-layered wiring structure to explain a dual-damascene process which may be utilized in the present invention.

First, referring to FIG. 1A which is a partial cross-sectional view of the multi-layered wiring structure which is in the process of construction, an insulating interlayer 100 is formed above a semiconductor substrate (not shown) by using a chemical vapor deposition (CVD) process. Note that the insulating interlayer 100 may be composed of a low-k insulating material such as SiOCH, SiOC, SiOF, L-Ox (Registered Trademark: ladder hydrogenated siloxane), hydrogen-silsesquioxane (HSQ), methyl-silsesquioxane (MSQ) or the like.

The insulating interlayer 100 has a plurality of via-plugs 101 and a plurality of interconnections 102 which are already formed therein by using the dual-damascene process which will be explained in detail hereinafter with reference to FIGS. 1A to 1H. Note, in FIG. 1A, only one of the via-plugs 101 and only one of the interconnections 102 are representatively shown.

After the formation of the via-plugs 101 and the interconnections 102 is completed, a cap layer or etching stopper layer 103 is formed on the insulating interlayer 100 by using a CVD process. The etching stopper layer 103 may be composed of a suitable insulating material such as silicon nitride (SiN), SiCN, or the like.

Figure 1B:
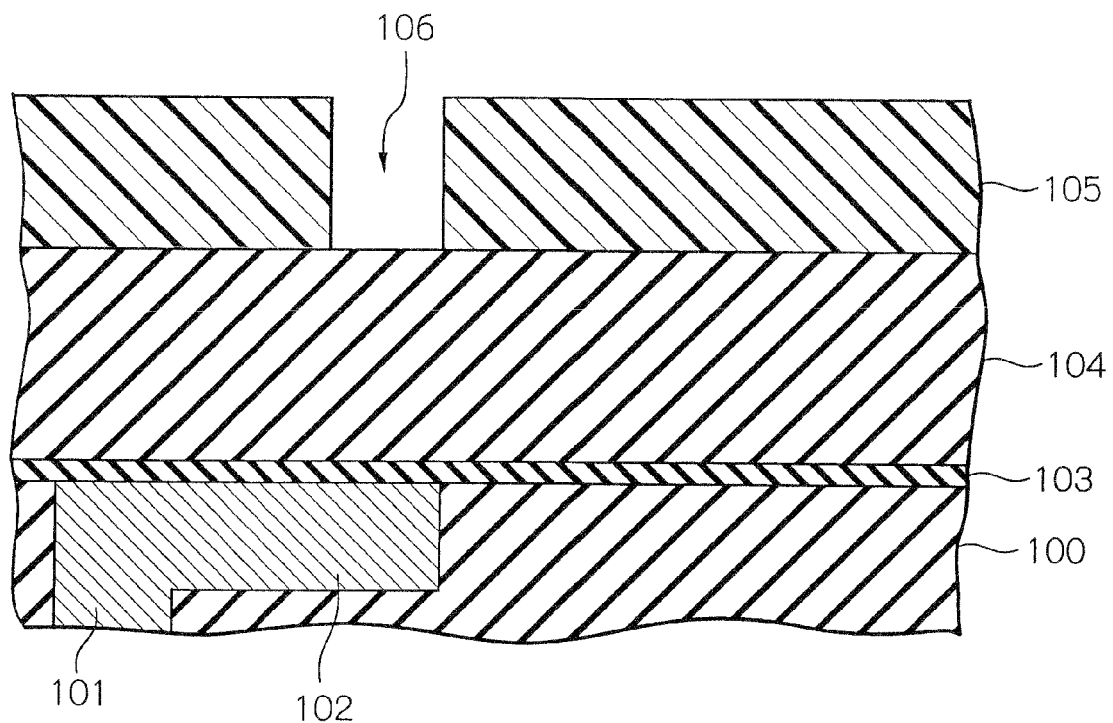

Next, as shown in FIG. 1B, an insulating interlayer 104 is formed on the etching stopper layer 103 by using a CVD process, and the insulating interlayer 104 may be composed of the same low-k material as that of the insulating interlayer 100. Then, a photoresist pattern layer 105 having a plurality of openings 106 defined therein is formed on the insulating interlayer 104 by using a photolithography process, in which a photomask (not shown) having a plurality of openings corresponding to the openings 106 is used. Note, in FIG. 1B, only one of the openings 106 is representatively shown.

Figure 1C:
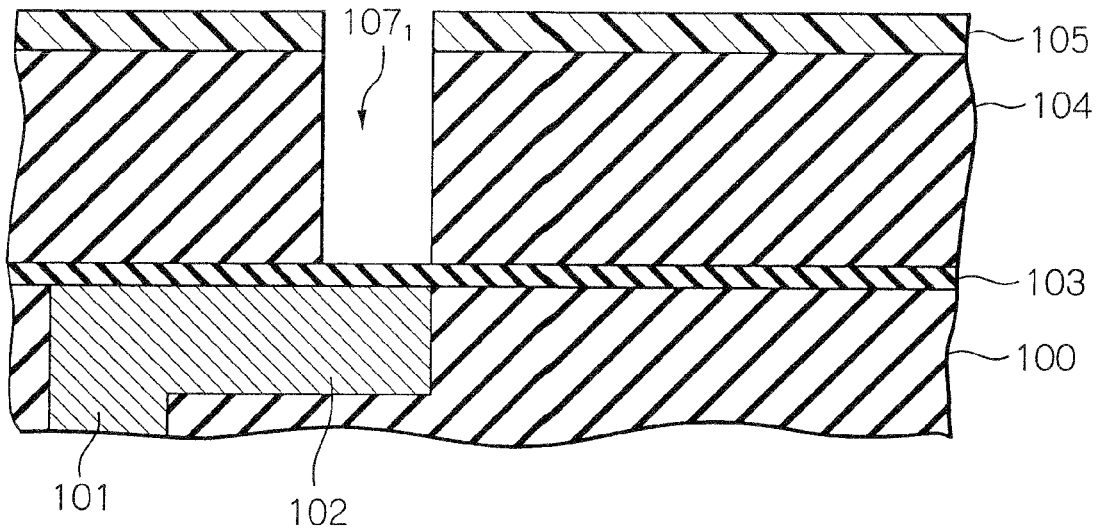

Next, as shown in FIG. 1C, the insulating interlayer 104, which is covered with the photoresist pattern layer 105 having the openings 106, is subjected to an anisotropic etching process or dry etching process, so that via-hole sections $107_1$ corresponding to the respective openings 106 are formed in the insulating interlayer 104. Note that the photoresist pattern layer 105 is etched back due to the dry etching process.

After the formation of the via-hole section $107_1$ in the insulating interlayer 104 is completed, the photoresist pattern layer 105 is removed from the insulating interlayer 104 by using, for example, an ashing process or dray etching process.

Figure 1D:
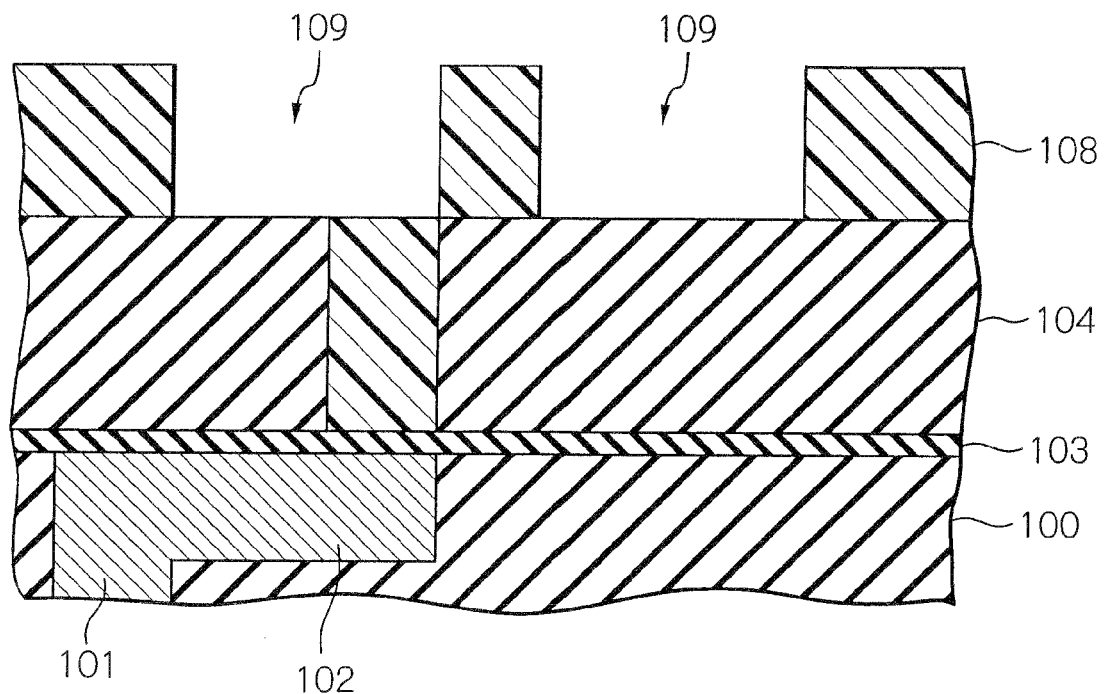

Next, as shown in FIG. 1D, a photoresist pattern layer 108 having a plurality of openings 109 defined therein is formed on the insulating interlayer 104 by using a photolithography process in which a photomask (not shown) having a plurality of openings corresponding to the openings 109 is used. Note that the via-hole section $107_1$ (see: FIG. 1C) is stuffed with a photoresist material forming the photoresist pattern layer 108.

Figure 1E:
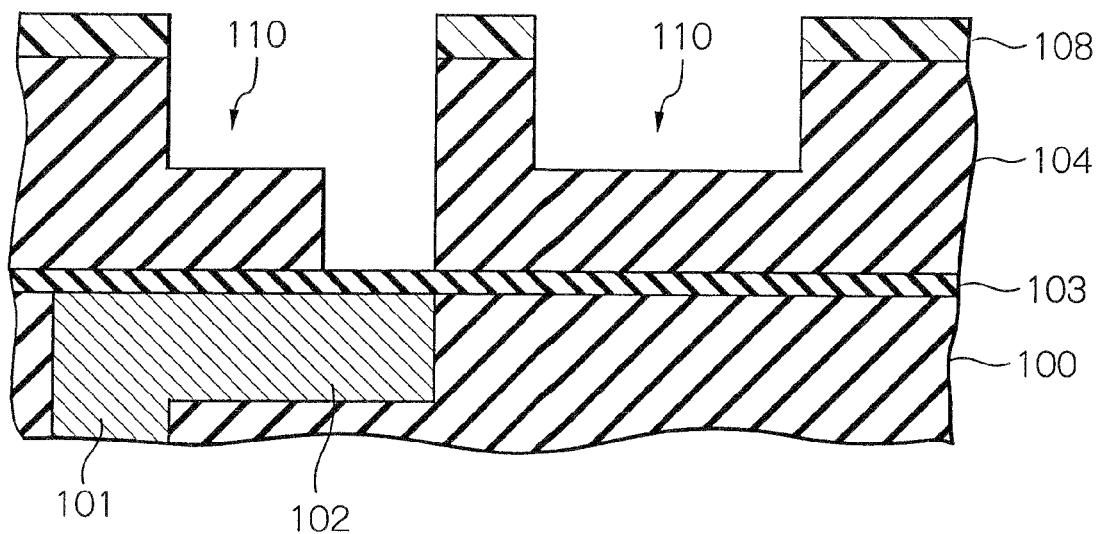

Next, as shown in FIG. 1E, the insulating interlayer 104, which is covered with the photoresist pattern layer 108 having the openings 106, is subjected to an anisotropic etching process or dry etching process, so that trenches 110 corresponding to the respective openings 109 are formed in the insulating interlayer 104. Note that the photoresist pattern layer 108 is etched back due to the dry etching process, and that the via-hole section $107_1$ is in communication with the corresponding trench 110.

Figure 1F:
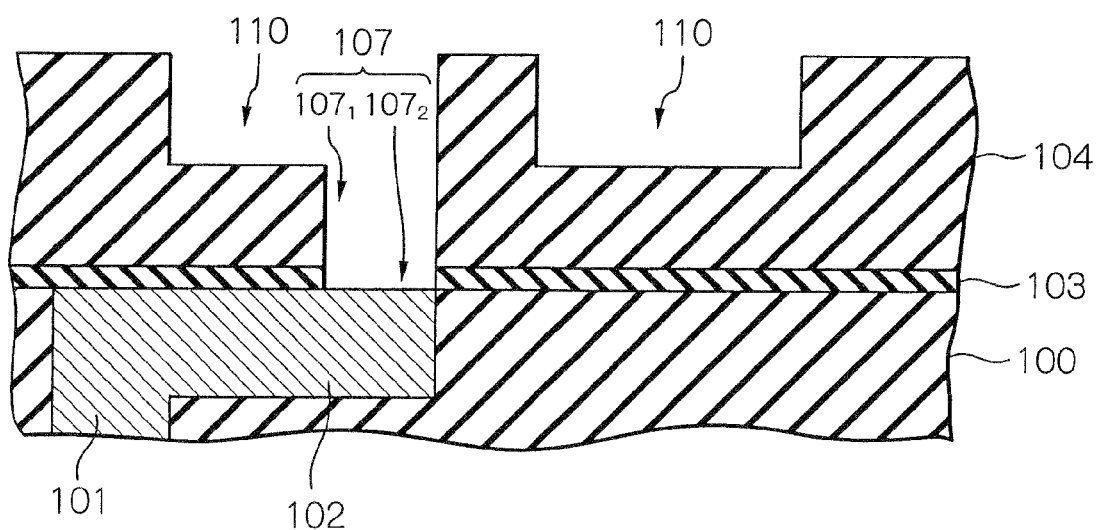

Next, as shown in FIG. 1F, the photoresist pattern layer 108 is removed from the insulating interlayer 104 by using, for example, an ashing process or dry etching process. At this time, a via-hole section $107_2$ is formed in the etching stopper layer 103 due to the ashing process or dry etching process. Namely, the ashing process or dry etching process is controlled so that the formation of the via-hole section $107_2$ in the etching stopper layer 103 is carried out. Thus, a via-hole 107 defined by both the hole sections $107_1$ and $107_2$ is formed in both the etching stopper layer 103 and the insulating interlayer 104.

Figure 1G:
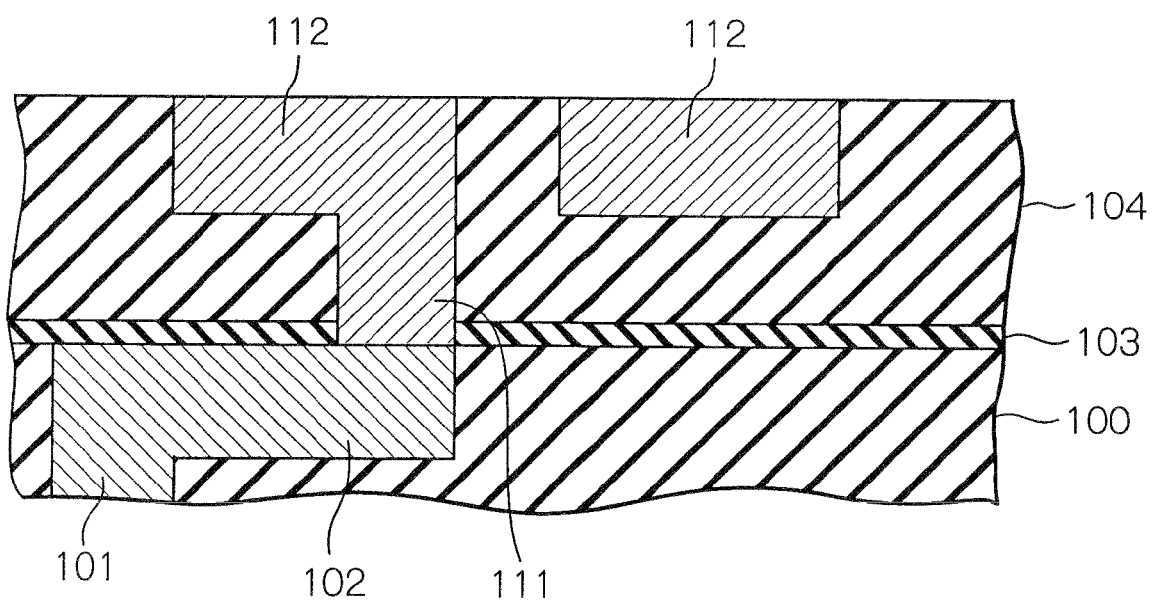

Next, as shown in FIG. 1G, the via-hole 107 and the trenches 110 are stuffed with a suitable metal material such as copper (Cu) by using an electroplating process, to thereby form a plurality of via-plugs 111 and a plurality of interconnections 112 in the insulating interlayer 104. Namely, the via-plugs 111 are defined by stuffing the via-hole 107 (see: FIG. 1F) with the metal material, and the interconnections 112 are defined by stuffing the trenches 110 (see: FIG. 1F) with the metal material.

Note, in FIG. 1G, the interconnections 112 define a circuit pattern layer formed in the insulating interlayer 104, and the circuit pattern layer concerned is electrically connected to a circuit pattern layer, which is defined by the interconnections 102, through the via-plugs 111.

If necessary, an etching stopper layer is further formed on the insulating interlayer 104, and an insulating interlayer is formed on the etching stopper layer. Then, a plurality of via-plugs and a plurality of interconnections are formed in the insulating interlayer concerned by using the dual-damascene process as explained with reference to FIGS. 1A to 1G.

In short, when the multi-layered wiring structure is constructed by using the dual-damascene process, a plurality of via-plugs and a plurality of interconnections are formed in a single insulating interlayer.

Although the above-mentioned dual-damascene process is of a via-first type in which the formation of the via-hole section $107_1$ (see: FIG. 1C) is prior to the formation of the trenches 110 (see: FIG. 1E), for the construction of the multi-layered wiring structure, it is possible to use a trench-first type dual-damascene process in which the formation of the trenches is prior to the formation of the via-hole sections in each of the insulating interlayers.

In either event, in the dual-damascene process, the aforesaid photomask (not shown) used to form the via-hole $107_1$ sections (see: FIG. 1C) and the photomask (not shown) used to form the trenches 110 (see: FIG. 1E) must be correctly positioned with respect to the semiconductor substrate before the via-plugs 111 can be properly arranged with respect to the interconnections 112. Nevertheless, one or two of the photomasks may be erroneously positioned with respect to the semiconductor substrate, so that the arrangement of the via-plugs 111 and the arrangement of the interconnections 112 may be relatively offset from each other.

Figure 2:
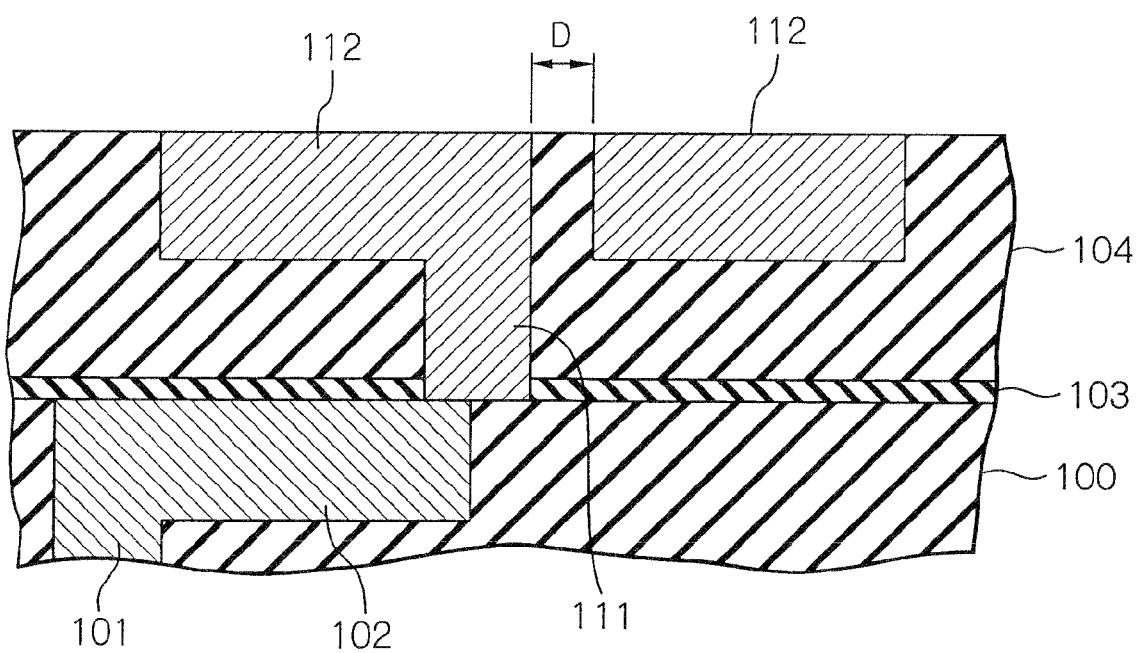
FIG. 2 is a partial cross-sectional view similar to FIG. 1H, in which a via-plug is positionally offset from interconnections.

For example, as representatively shown in FIG. 2 corresponding to FIG. 1G, when the arrangement of the via-plugs 111 is offset from the arrangement of the interconnections 112, a part of the via-plugs 111 may become close to a part of the interconnections 112.

Namely, in FIG. 2, the via-plug 111 concerned is close to the left interconnection 112 to define a small distance "D" therebetween. When the distance "D" is too small, a breakdown occurs between the via-plug 111 and the left interconnection 112, resulting in leakage of current therebetween.

Accordingly, during the construction of the multi-layered wiring structure, whenever a plurality of via-plugs and a plurality of interconnections are formed in an insulating interlayer, it is desirable to determine whether the via-plugs are correctly arranged with respect to the interconnections, if necessary.

Embodiment

Figure 3:
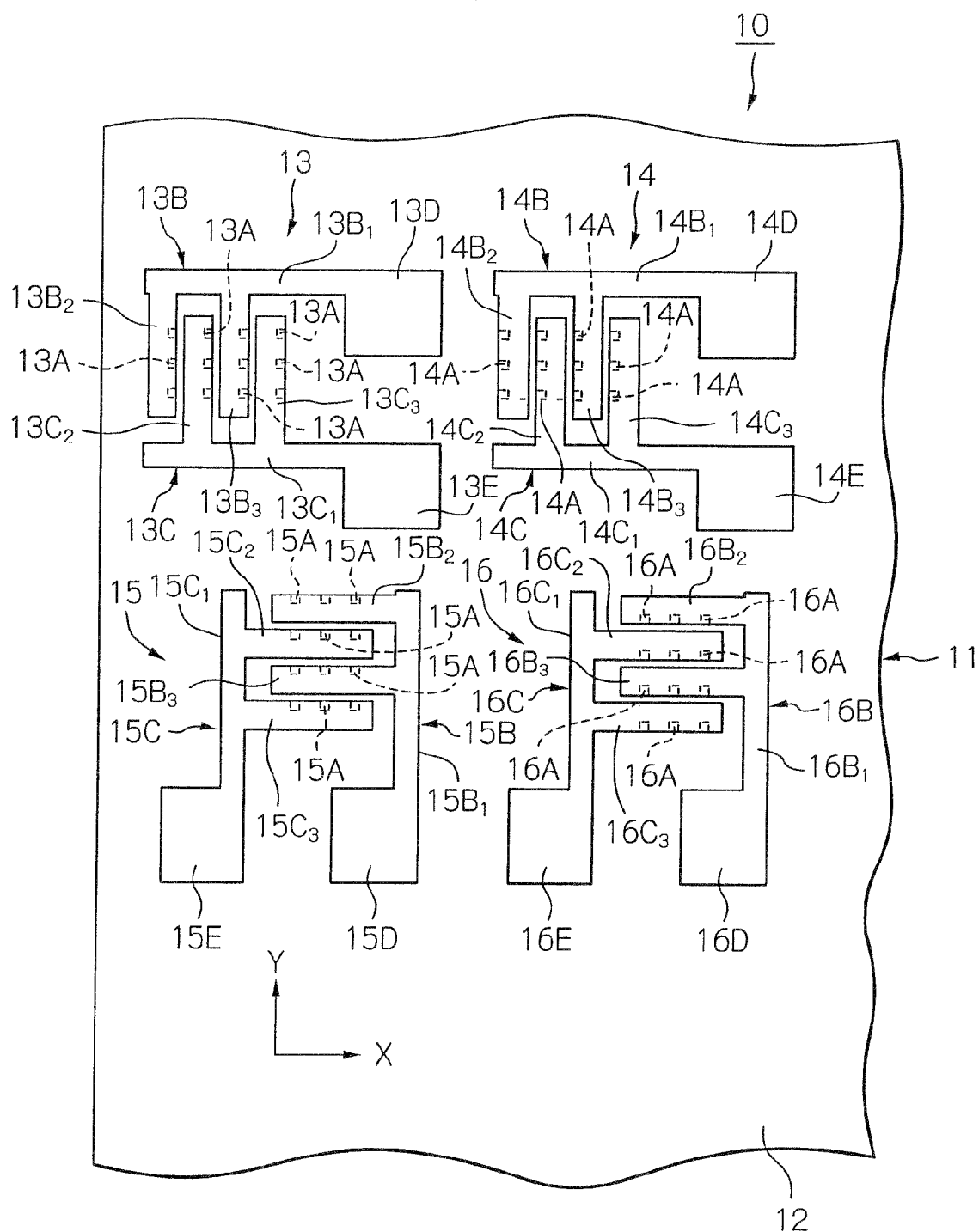
FIG. 3 is a partial plan view of an embodiment of a semiconductor device having four positional offset measurement pattern units, each of which includes metrical via-plugs and metrical interconnections, according to the present invention.

With reference to FIG. 3 which is a partial plan view of an embodiment of a semiconductor device according to the present invention, the semiconductor device is generally indicated by reference 10.

The semiconductor device 10 includes a multi-layered wiring structure 11 constructed on a semiconductor substrate (not visible), with the multi-layered wiring structure 11 being in the process of construction. Note, in FIG. 3, an X-Y coordinate system is defined on a surface of the multi-layered wiring structure 11 for the sake of convenience of explanation.

The multi-layered wiring structure 11 has an insulating interlayer 12 which is already formed as an uppermost one, and the insulating interlayer 12 may be composed of a suitable low-k insulating material such as SiOCH, SiOC, SiOF, L-Ox, HSQ, MSQ or the like.

Although not illustrated in FIG. 3, the insulating interlayer 12 has a plurality of proper via-plugs and a plurality of proper interconnections which are formed therein by using a dual-damascene process, as explained with reference to FIGS. 1A through 1H, and the proper via-plugs and the proper interconnections may be composed of a suitable metal material such as copper (Cu).

As shown in FIG. 3, the semiconductor device 10 is provided with four positional offset measurement pattern units 13, 14, 15 and 16 incorporated in the insulating interlayer 12, and the positional offset measurement pattern units 13, 14, 15 and 16 are simultaneously formed when the proper via-plugs and the proper interconnections are formed by using the dual-damascene process, with the units 13, 14, and 16 being composed of copper (Cu). Note that the positional offset measurement pattern units 13, 14, 15 and 16 are formed in a suitable margin area of the insulating interlayer 12.

The positional offset measurement pattern unit 13 is provided for measuring a positional offset between the arrangement of the proper via-plugs and the arrangement of the proper interconnections in the plus direction of the X-axis of the X-Y coordinate system.

The positional offset measurement pattern unit 13 includes a plurality of metrical via-plugs 13A which are formed in the insulating interlayer 12 so as to be arranged in a 3×4 matrix manner at substantially the same level as the proper via-plugs. Namely, the four columns each having the three metrical via-plugs 13A are arranged at a given pitch.

Note, in this embodiment, although each of the metrical via-plugs 13A is configured as a pillar having a square cross section, it may have a circular cross section.

The positional offset measurement pattern unit 13 also includes two metrical interconnections 13B and 13C which are formed in the insulating interlayer 12 at substantially the same level as the proper interconnections. The metrical interconnection 13B has an elongated section $13B_1$ lying along the X-axis of the X-Y coordinate system, and two strip-like sections $13B_2$ and $13B_3$ integrally extending from the elongated section $13B_1$ along the Y-axis of the X-Y coordinate system. Similarly, the metrical interconnection 13C has an elongated section $13C_1$ lying along the X-axis of the X-Y coordinate system, and two strip-like sections $13C_2$ and $13C_3$ integrally extending from the elongated section $13C_1$ along the Y-axis of the X-Y coordinate system.

As shown in FIG. 3, the strip-like sections $13B_2$ and $13B_3$ and the strip-like sections $13C_2$ and $13C_3$ interdigitate with each other, i.e., are alternately arranged at the same pitch as the four columns each having the three metrical via-plugs 13A, and each of the strip-like sections $13B_2$, $13C_2$, $13B_3$ and $13C_3$ is electrically connected to the three metrical via-plugs 13A included in the corresponding column. Note that the metrical via-plugs 13A have a smaller size than a width of the strip-like section $13B_2$, $13C_2$, $13B_3$ and $13C_3$.

The positional offset measurement pattern unit 13 further includes two electrode pads 13D and 13E which are formed in the insulating interlayer 12 at substantially the same level as the proper interconnections, and which are electrically connected to the elongated sections $13B_1$ and $13C_1$ of the respective metrical interconnections 13B and 13C.

Figure 4A:
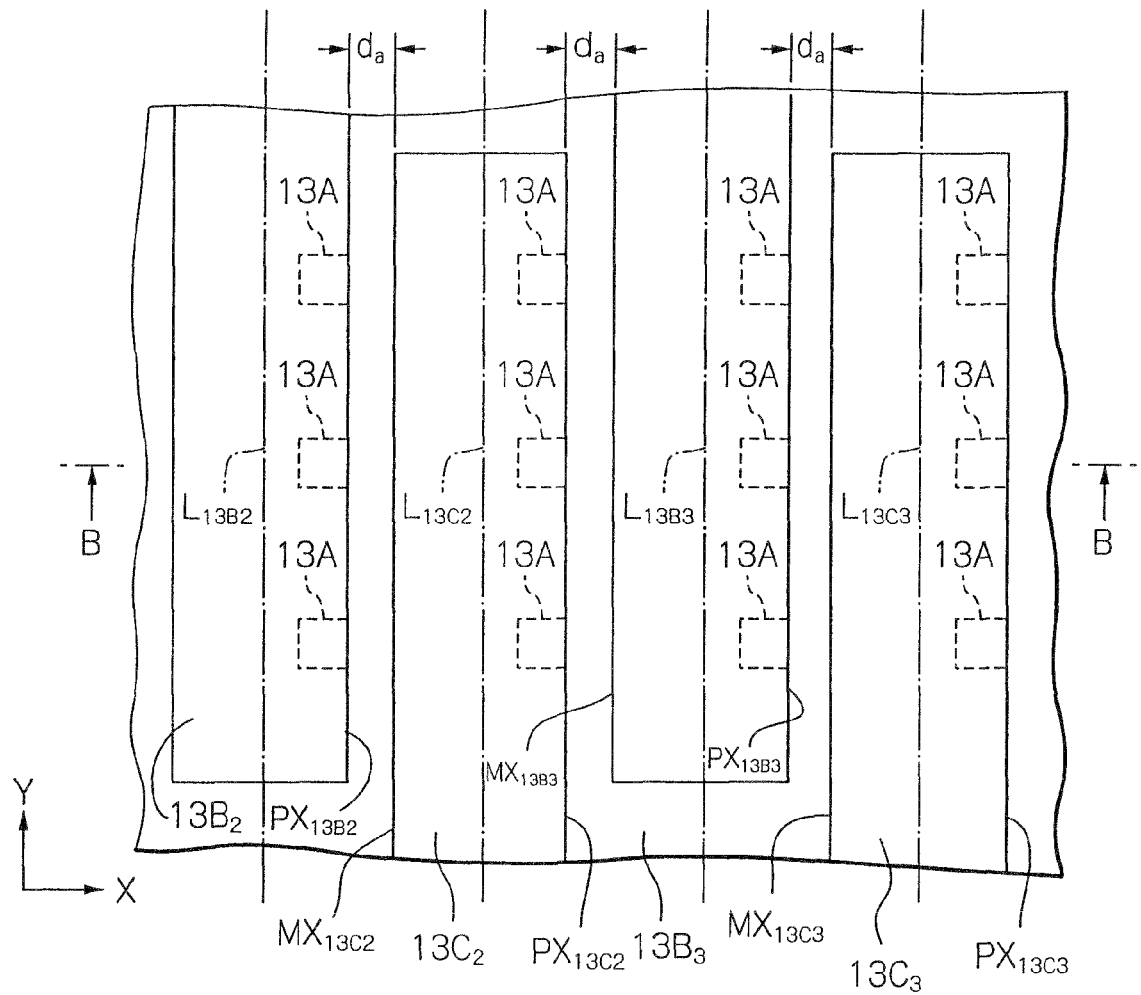
FIG. 4A is a partially-enlarged plan view showing one of the four positional offset measurement pattern units of FIG. 3.

As shown in FIG. 4A which is a partially-enlarged plan view showing a part of the positional offset measurement pattern unit 13 of FIG. 3, when the proper via-plugs and the proper interconnections are correctly arranged with respect to each other, the three metrical via-plugs 13A, which are electrically connected to the strip-like section $13B_2$, are arranged so that respective side faces of the three metrical via-plugs 13A concerned are coplanar with a side face of the strip-like section $13B_2$ which is defined as a plus X-side face $PX_{13B2}$ with respect to a longitudinal central axis $L_{13B2}$ of the strip-like section $13B_2$, and are spaced apart by a distance "$d_a$" from a side face of the strip-like section $13C_2$ which is defined as a minus X-side face $MX_{13C2}$ with respect to a longitudinal central axis $L_{13C2}$ of the strip-like section $13C_2$.

Similarly, the three metrical via-plugs 13A, which are electrically connected to the strip-like section $13C_2$, are arranged so that respective side faces of the three metrical via-plugs 13A concerned are coplanar with a side face of the strip-like section $13C_2$ which is defined as a plus X-side face $PX_{13C2}$ with respect to the longitudinal central axis $L_{13C2}$ of the strip-like section $13C_2$, and are spaced apart by a distance "$d_a$" from a side face of the strip-like section $13B_3$ which is defined as a minus X-side face $MX_{13B3}$ with respect to a longitudinal central axis $L_{13B3}$ of the strip-like section $13B_3$.

Further, the three metrical via-plugs 13A, which are electrically connected to the strip-like section $13B_3$, are arranged so that respective side faces of the three metrical via-plugs 13A concerned are coplanar with a side face of the strip-like section $13B_3$ which is defined as a plus X-side face $PX_{13B3}$ with respect to the longitudinal central axis $L_{13B3}$ of the strip-like section $13B_3$, and are spaced apart by a distance "$d_a$" from a side face of the strip-like section $13C_3$ which is defined as a minus X-side face $MX_{13C3}$ with respect to a longitudinal central axis $L_{13C3}$ of the strip-like section $13C_3$.

Preferably, each of the metrical via-plugs 13A has a side length which is substantially equal to the distance "$d_a$". When each of the metrical via-plugs 13A has the circular cross section, it has a diameter of which is substantially equal to the distance "$d_a$".

Although the three metrical via-plugs 13A, which are electrically connected to the strip-like section $13C_3$, are also arranged so that respective side faces of the three metrical via-plugs 13A concerned are coplanar with a side face of the strip-like section $13C_3$ which is defined as a plus X-side face $PX_{13C3}$ with respect to the longitudinal central axis $L_{13C3}$ of the strip-like section $13C_3$, the metrical via-plugs 13A concerned are merely formed as dummy via-plugs, and thus do not participate in the measurement of the positional offset between the arrangement of the proper via-plugs and the arrangement of the proper interconnections in the plus direction of the X-axis of the X-Y coordinate system.

Figure 4B:
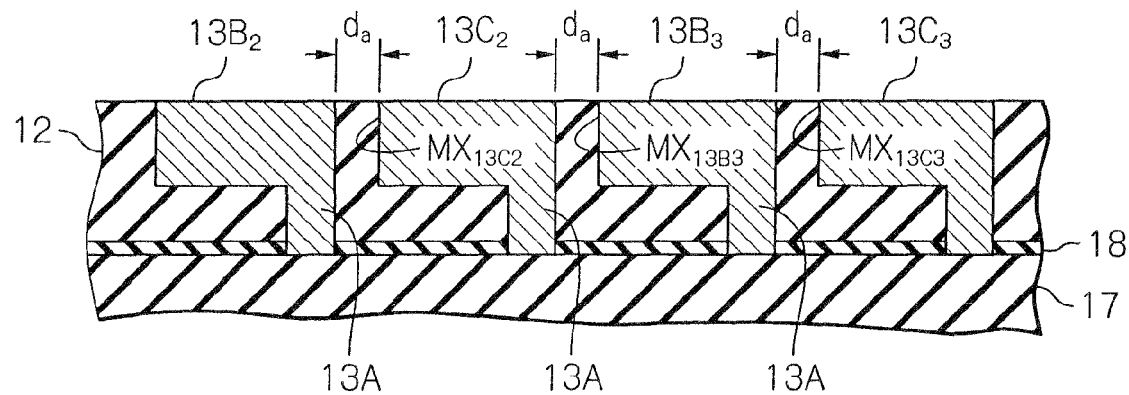
FIG. 4B is a cross-sectional view taken along the B-B line of FIG. 4A.

In FIG. 4B which is a cross-sectional view taken along the B-B line of FIG. 4A, reference numerical 17 indicates an insulating interlayer formed above the semiconductor substrate (not shown) prior to the formation of the insulating interlayer 12, and reference numerical 18 indicates a cap layer or etching stopper layer formed on the insulating interlayer 17. Note that the insulating interlayer 17 has a plurality of proper via-plugs (not shown) and a plurality of proper interconnections (not shown) formed therein, and four positional offset measurement pattern units, as shown in FIG. 3, may be incorporated in a marginal area of the insulating interlayer 17, if necessary.

Usually, although each of the metrical via-plugs 13A is defined as extending from the top surface of the insulating interlayer 17 to the bottom surface of the corresponding metrical interconnection $13B_2$, $13C_2$, $13B_3$ or $13C_3$, it may be regarded as extending from the top surface of the insulating interlayer 17 to the top surface of the insulating interlayer 12. In this sense, it can be said that the three sets of three metrical via-plugs 13A, which are electrically connected to the respective strip-like sections $13B_2$, $13C_2$ and $13B_3$, confront the minus X-side faces $MX_{13C2}$, $MX_{13B3}$ and $MX_{13C3}$ of the respective strip-like sections $13C_2$, $13B_3$ and $13C_3$.

Figure 5A:
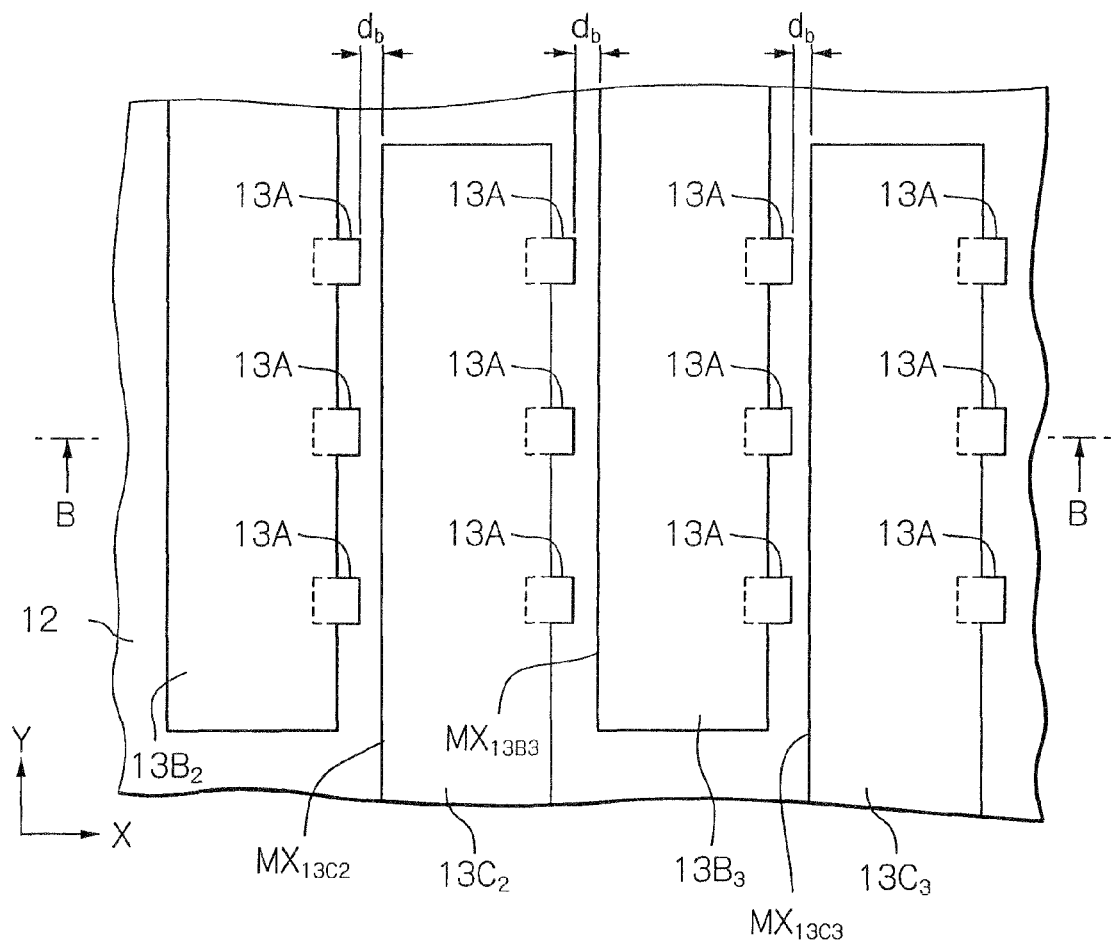
FIG. 5A is a partially-enlarged plan view, corresponding to FIG. 4A, in which the metrical via-plugs of FIG. 4A are shifted from the metrical interconnections of FIG. 4A in a plus direction of an X-axis of an X-Y coordinate system.
Figure 5B:
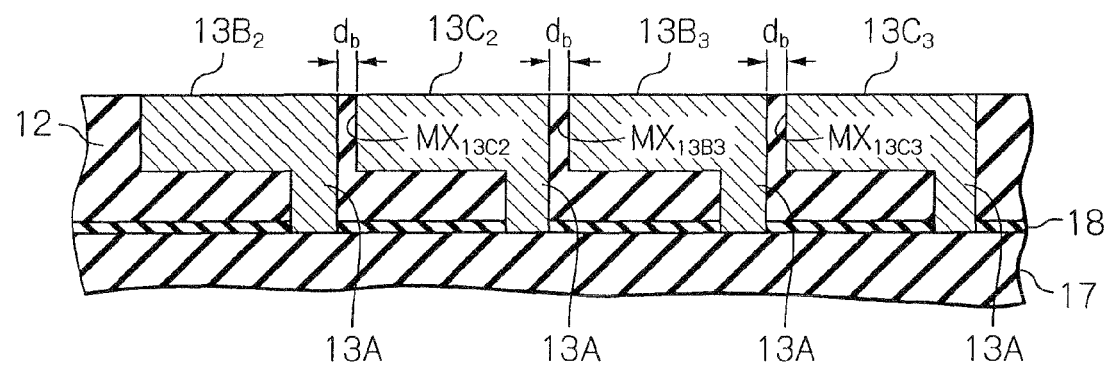
FIG. 5B is a cross-sectional view taken along the B-B line of FIG. 5A.

As shown in FIGS. 5A and 5B corresponding to FIGS. 4A and 4B, respectively, for example, when the proper via-plugs are offset from the proper interconnections in the plus direction of the X-axis of the X-Y coordinate system, the three sets of three metrical via-plugs 13A, which are electrically connected to the respective strip-like sections $13B_2$, $13C_2$ and $13B_3$, are shifted toward the minus X-side faces $MX_{13C2}$, $MX_{13B3}$ and $MX_{13C3}$ of the respective strip-like sections $13C_2$, $13B_3$ and $13C_3$ in accordance with the positional offset between the arrangement of the proper via-plugs and the arrangement of the proper interconnections, and thus the distances "$d_a$" (see: FIGS. 4A and 4B) are reduced to distances "$d_b$" (see: FIGS. 5A and 5B).

When the positional offset between the arrangement of the proper via-plugs and the arrangement of the proper interconnections in the plus direction of the X-axis of the X-Y coordinate system is measured by using the positional offset measurement pattern unit 13, a voltage is applied between the electrode pads 13D and 13E, and is gradually stepped up until a breakdown occurs between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$.

Of course, the breakdown voltage, which is measured when the three sets of three metrical via-plugs 13A are spaced apart from the respective minus X-side faces $MX_{13C2}$, $MX_{13B3}$ and $MX_{13C3}$ of the respective strip-like section $13C_2$, $13B_3$ and $13C_3$ by the distance "$d_a$" (see: FIGS. 4A and 4B), is larger than the breakdown voltage which is measured when the three sets of three metrical via-plugs 13A are spaced apart from the respective minus X-side faces $MX_{13C2}$, $MX_{13B3}$ and $MX_{13C3}$ of the strip-like section $13C_2$, $13B_3$ and $13C_3$ by the distance "$d_b$" (see: FIGS. 5A and 5B).

Namely, when a distance between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$ is defined as a variable "d" representing a positional offset in the plus direction of the X-axis of the X-Y coordinate system between the arrangement of the proper via-plugs and the arrangement of the proper interconnections, and when a breakdown voltage measured therebetween is defined as a variable "V", it is possible to represent a relationship between the variable or distance "d" and the variable or breakdown voltage "V" by a given characteristic curve.

Figure 6:
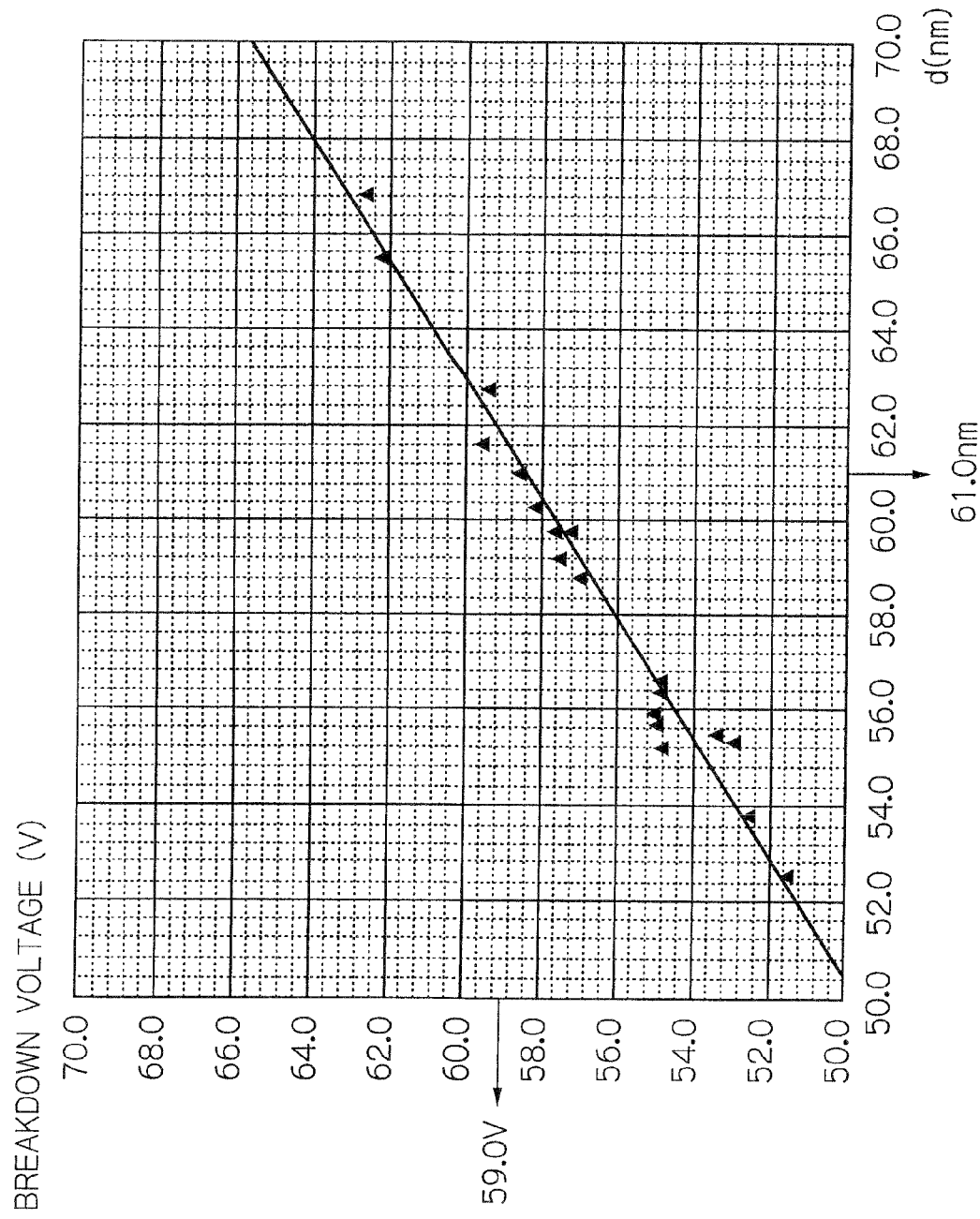
FIG. 6 is a graph showing a relationship between a distance "d" between a set of three metrical via-plugs and the corresponding metrical interconnection of FIGS. 4A and 5A and a breakdown voltage "V" measured therebetween.

FIG. 6 shows a graph representing the relationship between the distance "d" and the breakdown voltage "V".

The graph of FIG. 6 was obtained from many samples each having a plurality of positional offset measurement pattern units in which three sets of three metrical via-plugs (13A) were deliberately offset from respective minus X-side face ($MX_{13C2}$, $MX_{13B3}$ and $MX_{13C3}$) of strip-like section ($13C_2$, $13B_3$ and $13C_3$).

In particular, a breakdown actually occurred in each of the positional offset measurement pattern units of the samples, and a breakdown voltage "V" was determined. Then, each of the samples was cut along a line passing through each of the metrical via-plugs (13A) and the minus X-side face ($MX_{13C2}$, $MX_{13B3}$ or $MX_{13C3}$) of the corresponding strip-like section ($13C_2$, $13B_3$ or $13C_3$), and a distance "d" was measured by using an electron microscope. Subsequently, the determined breakdown voltages "V" and the measured distances "d" were plotted, resulting in the completion of the graph of FIG. 6.

In the graph of FIG. 6, the distance "$d_a$" (see: FIGS. 4A and 4B) between the three sets of three metrical via-plugs 13A and the respective minus X-side faces $MX_{13C2}$, $MX_{13B3}$ and $MX_{13C3}$, corresponds to 61.0 nm. Namely, when a voltage of 59.0 volts is applied between the three sets of three metrical via-plugs 13A and the respective minus X-side faces $MX_{13C2}$, $MX_{13B3}$ and $MX_{13C3}$, a breakdown occurs therebetween. In short, in FIG. 3, when the proper via-plugs are correctly arranged with the proper interconnections along the X-axis of the X-Y coordinate system, the positional offset measurement pattern unit 13 features the breakdown voltage of 69.0 volts.

In reality, when the breakdown voltage falls within the range from 58.0 volts to 60.0 volts, i.e., when the distance "d" between the three sets of three metrical via-plugs 13A and the respective minus X-side faces $MX_{13C2}$, $MX_{13B3}$ and $MX_{13C3}$ falls within the range from 60.0 nm to 62.0 nm, it can be considered that the proper via-plugs are correctly arranged with respect to the proper interconnections along the X-axis of the X-Y coordinate system.

Returning to FIG. 3, the positional offset measurement pattern unit 14 is provided for measuring a positional offset between the arrangement of the proper via-plugs and the arrangement of the proper interconnections in the minus direction of the X-axis of the X-Y coordinate system.

The positional offset measurement pattern unit 14 includes a plurality of metrical via-plugs 14A having the same size as the via-plugs 13A, and the metrical via-plugs 14A are formed in the insulating interlayer 12 so as to be arranged in a 3×4 matrix manner at substantially the same level as the proper via-plugs. Namely, the four columns each having the three metrical via-plugs 14A are arranged at the same pitch as the four columns each having the three metrical via-plugs 13A of the positional offset measurement pattern unit 13.

The positional offset measurement pattern unit 14 also includes two metrical interconnections 14B and 14C which are formed in the insulating interlayer 12 at substantially the same level as the proper interconnections. The metrical interconnection 14B has an elongated section $14B_1$ lying along the X-axis of the X-Y coordinate system, and two strip-like sections $14B_2$ and $14B_3$ integrally extending from the elongated section $14B_1$ along the Y-axis of the X-Y coordinate system. Similarly, the metrical interconnection 14C has an elongated section $14C_1$ lying along the X-axis of the X-Y coordinate system, and two strip-like sections $14C_2$ and $14C_3$ integrally extending from the elongated section $14C_1$ along the Y-axis of the X-Y coordinate system.

As shown in FIG. 3, the strip-like sections $14B_2$ and $14B_3$ and the strip-like sections $14C_2$ and $14C_3$ interdigitate with each other, i.e., are alternately arranged at the same pitch as the four columns each having the three metrical via-plugs 14A, and each of the strip-like sections $14B_2$, $14C_2$, $14B_3$ and $14C_3$ is electrically connected to the three metrical via-plugs 14A included in the corresponding column. Note that the metrical via-plugs 14A have a smaller size than a width of the strip-like section $14B_2$, $14C_2$, $14B_3$ and $14C_3$.

The positional offset measurement pattern unit 14 further includes two electrode pads 14D and 14E which are formed in the insulating interlayer 12 at substantially the same level as the proper interconnections, and which are electrically connected to the elongated sections $14B_1$ and $14C_1$ of the respective metrical interconnections 14B and 14C.

Figure 7A:
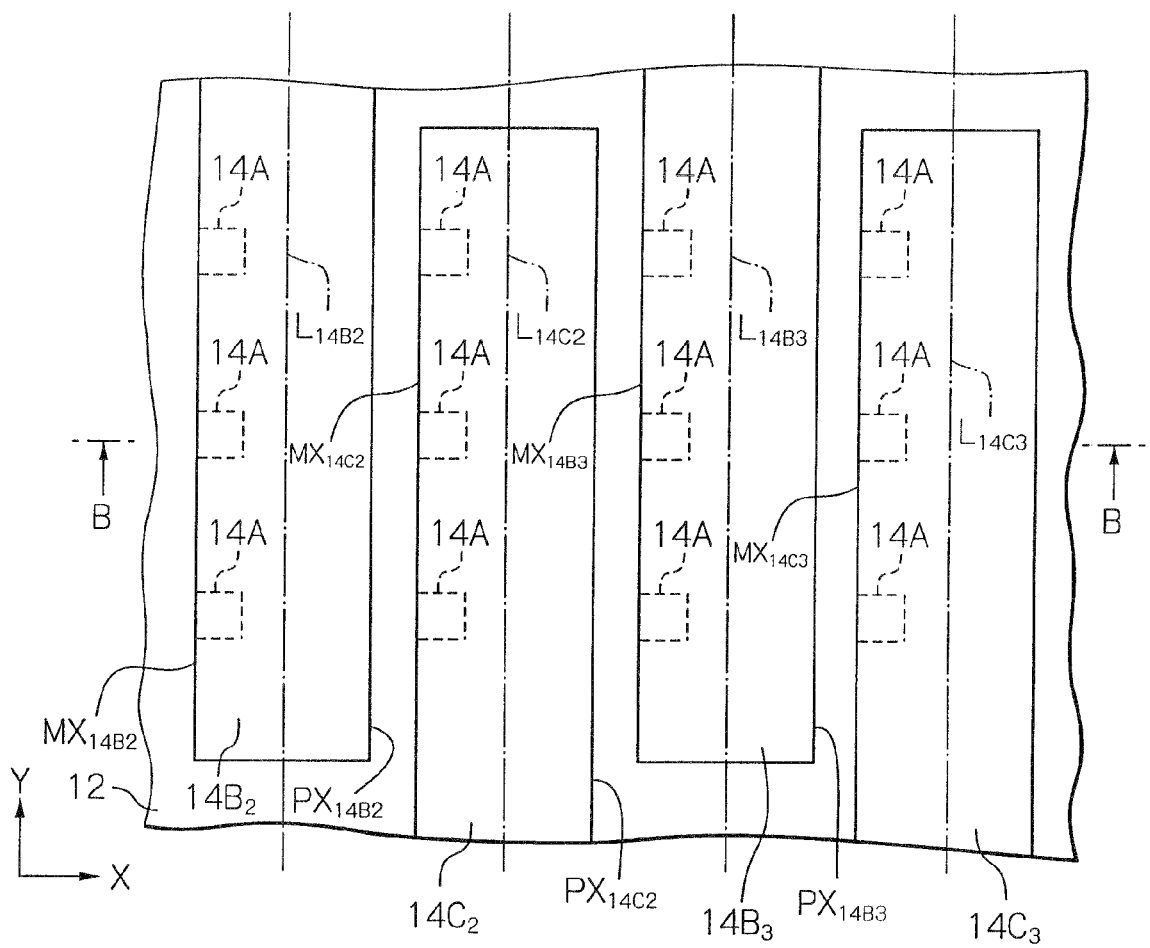
FIG. 7A is a partially-enlarged plan view showing another one of the four positional offset measurement pattern units of FIG. 3.

As shown in FIG. 7A which is a partially-enlarged plan view showing a part of the positional offset measurement pattern unit 14 of FIG. 3, when the proper via-plugs and the proper interconnections are correctly arranged with respect to each other, the three metrical via-plugs 14A, which are electrically connected to the strip-like section $14B_2$, are arranged so that respective side faces of the three metrical via-plugs 14A concerned are coplanar with a side face of the strip-like section $14B_2$ which is defined as a minus X-side face $MX_{14B2}$ with respect to a longitudinal central axis $L_{14B2}$ of the strip-like section $14B_2$. Note that the metrical via-plugs 14A concerned are merely formed as dummy via-plugs, and thus do not participate in the measurement of the positional offset between the arrangement of the proper via-plugs and the arrangement of the proper interconnections in the minus direction of the X-axis of the X-Y coordinate system.

The three metrical via-plugs 14A, which are electrically connected to the strip-like section $14C_2$, are arranged so that respective side faces of the three metrical via-plugs 14A concerned are coplanar with a side face of the strip-like section $14C_2$ which is defined as a minus X-side face $MX_{14C2}$ with respect to a longitudinal central axis $L_{14C2}$ of the strip-like section $14C_2$, and are spaced apart by a distance "$d_a$" from a side face of the strip-like section $14B_2$ which is defined as a plus X-side face $PX_{14B2}$ with respect to the longitudinal central axis $L_{14B2}$ of the strip-like section $14B_2$.

Similarly, the three metrical via-plugs 14A, which are electrically connected to the strip-like section $14B_3$, are arranged so that respective side faces of the three metrical via-plugs 14A concerned are coplanar with a side face of the strip-like section $14B_3$ which is defined as a minus X-side face $MX_{14B3}$ with respect to a longitudinal central axis $L_{14B3}$ of the strip-like section $14B_3$, and are spaced apart by a distance "$d_a$" from a side face of the strip-like section $14C_2$ which is defined as a plus X-side face $PX_{14C2}$ with respect to the longitudinal central axis $L_{14C2}$ of the strip-like section $14C_2$.

Further, the three metrical via-plugs 14A, which are electrically connected to the strip-like section $14C_3$, are arranged so that respective side faces of the three metrical via-plugs 14A concerned are coplanar with a side face of the strip-like section $14C_3$ which is defined as a minus X-side face $MX_{14C3}$ with respect to a longitudinal central axis $L_{14C3}$ of the strip-like section $14C_3$, and are spaced apart by a distance "$d_a$" from a side face of the strip-like section $14B_3$ which is defined as a plus X-side face $PX_{14B3}$ with respect to the longitudinal central axis $L_{14B3}$ of the strip-like section $14B_3$.

Figure 7B:
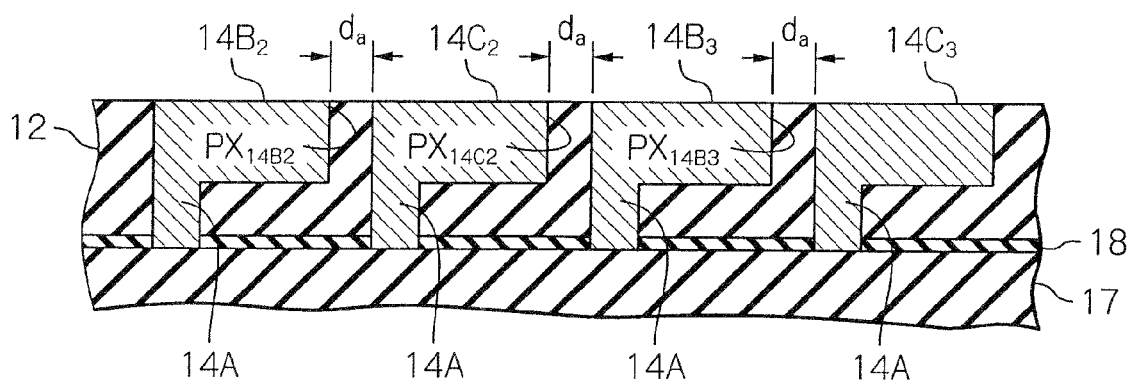
FIG. 7B is a cross-sectional view taken along the B-B line of FIG. 7A.

In FIG. 7B which is a cross-sectional view taken along the B-B line of FIG. 7A, as stated above, the insulating interlayer 17, having the proper via-plugs (not shown) and the proper interconnections (not shown) formed therein, is formed above the semiconductor substrate (not shown) prior to the formation of the insulating interlayer 12, and the cap layer or etching stopper layer 18 is formed on the insulating interlayer 17.

Usually, although each of the metrical via-plugs 14A is defined as extending from the top surface of the insulating interlayer 17 to the bottom surface of the corresponding metrical interconnection $14B_2$, $14C_2$, $14B_3$ or $14C_3$, it may be regarded as extending from the top surface of the insulating interlayer 17 to the top surface of the insulating interlayer 12. In this sense, it can be said that the three sets of three metrical via-plugs 14A, which are electrically connected to the respective strip-like sections $14C_2$, $14B_3$ and $14C_3$, confront the plus X-side faces $PX_{14B2}$, $PX_{14C2}$ and $PX_{14B3}$ of the respective strip-like sections $14B_2$, $14C_2$ and $14B_3$.

Figure 8A:
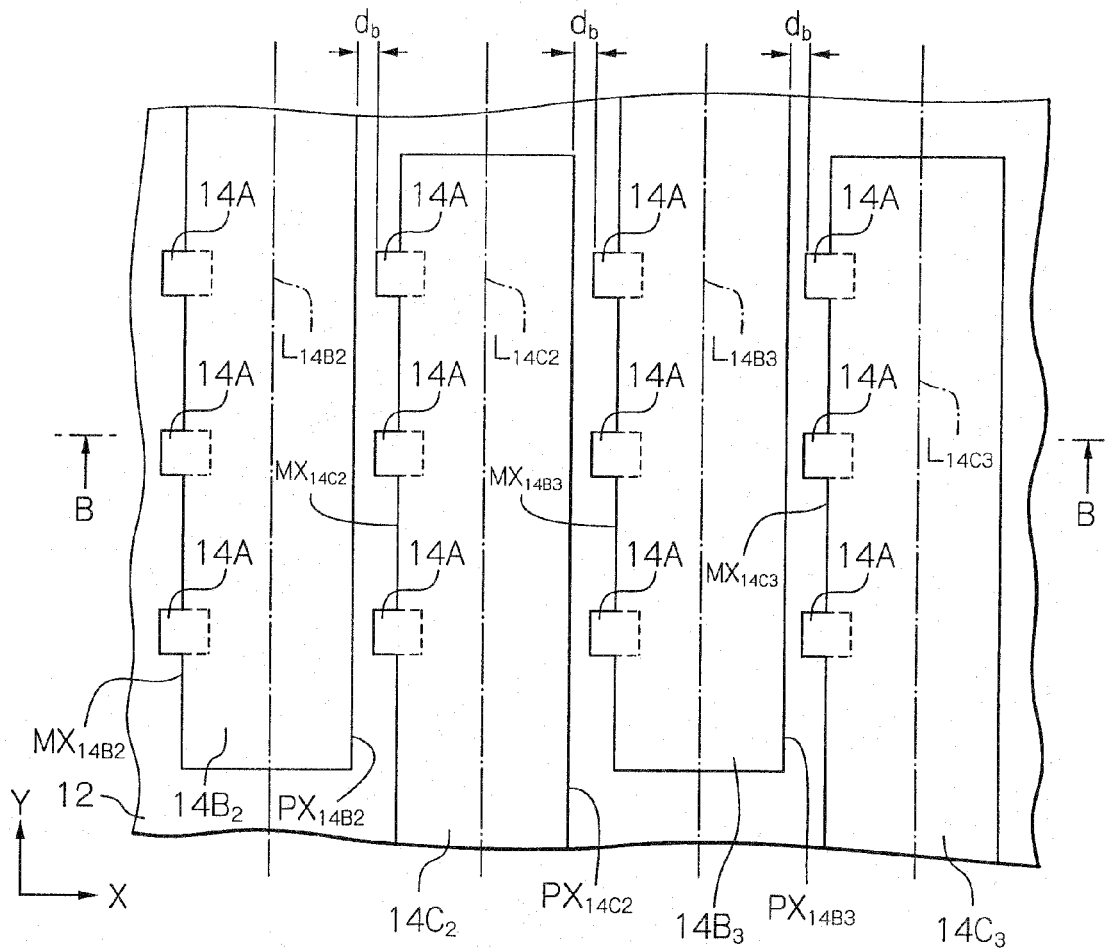
FIG. 8A is a partially-enlarged plan view, corresponding to FIG. 7A, in which the metrical via-plugs of FIG. 7A are shifted from the metrical interconnections of FIG. 7A in a minus direction of the X-axis of the X-Y coordinate system.
Figure 8B:
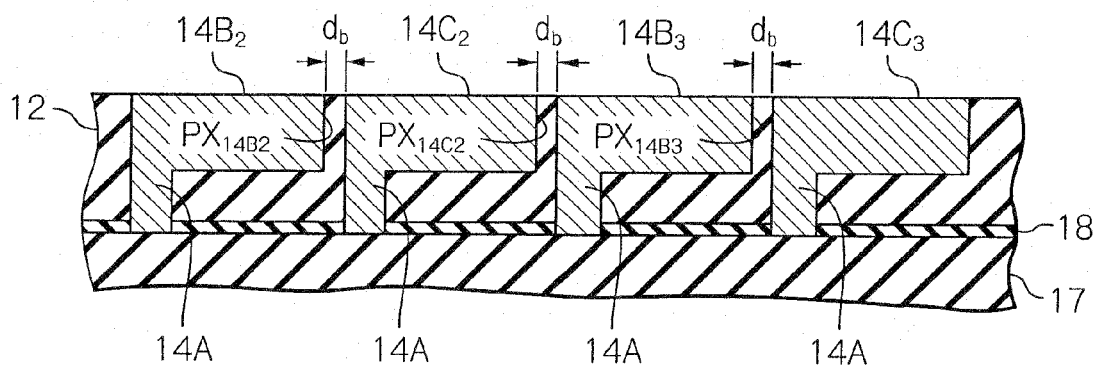
FIG. 8B is a cross-sectional view taken along the B-B line of FIG. 8A.

As shown in FIGS. 8A and 8B corresponding to FIGS. 7A and 7B, respectively, for example, when the proper via-plugs are offset from the proper interconnections in the minus direction of the X-axis of the X-Y coordinate system, the three sets of three metrical via-plugs 14A, which are electrically connected to the respective strip-like sections $14C_2$, $14B_3$ and $14C_3$, are shifted toward the plus X-side faces $PX_{14B2}$, $PX_{14C2}$ and $PX_{14B3}$ of the respective strip-like sections $14B_2$, $14C_2$ and $14B_3$ in accordance with the positional offset between the arrangement of the proper via-plugs and the arrangement of the proper interconnections, and thus the distances "$d_a$" (see: FIGS. 7A and 7B) are reduced to distances "$d_b$" (see: FIGS. 8A and 8B).

When the positional offset between the arrangement of the proper via-plugs and the arrangement of the proper interconnections in the minus direction of the X-axis of the X-Y coordinate system is measured by using the positional offset measurement pattern unit 14, a voltage is applied between the electrode pads 14D and 14E, and is gradually stepped up until a breakdown occurs between the three sets of three metrical via-plugs 14A and the plus X-side faces $PX_{14B2}$, $PX_{14C2}$ and $PX_{14B3}$ of the respective strip-like section $14B_2$, $14C_2$ and $14B_3$.

Of course, the breakdown voltage, which is measured when the three sets of three metrical via-plugs 14A are spaced apart from the respective plus X-side faces $PX_{14B2}$, $PX_{14C2}$ and $PX_{14B3}$ of the respective strip-like section $14B_2$, $14C_2$ and $14B_3$ by the distance "$d_a$" (see: FIGS. 7A and 7B), is larger than the breakdown voltage which is measured when the three sets of three metrical via-plugs 14A are spaced apart from the respective plus X-side faces $PX_{14B2}$, $PX_{14C2}$ and $PX_{14B3}$ of the respective strip-like section $14B_2$, $14C_2$ and $14B_3$ by the distance "$d_b$" (see: FIGS. 8A and 8B).

Thus, similar to the case of the positional offset measurement pattern unit 13, when a distance between the three sets of three metrical via-plugs 14A and the respective plus X-side face $PX_{14B2}$, $PX_{14C2}$ and $PX_{14B3}$ of the respective strip-like section $14B_2$, $14C_2$ and $14B_3$ is defined as a variable "d" representing a positional offset in the minus direction of the X-axis of the X-Y coordinate system between the arrangement of the proper via-plugs and the arrangement of the proper interconnections, and when a breakdown voltage measured therebetween is defined as a variable "V", it is possible to represent the relationship between the variable or distance "d" and the variable or breakdown voltage "V" by the graph of FIG. 6.

Referring again to FIG. 3, the positional offset measurement pattern unit 15 is provided for measuring a positional offset between the arrangement of the proper via-plugs and the arrangement of the proper interconnections in the plus direction of the Y-axis of the X-Y coordinate system.

The positional offset measurement pattern unit 15 includes a plurality of metrical via-plugs 15A having the same size as the via-plugs 13A, and the metrical via-plugs 15A are formed in the insulating interlayer 12 so as to be arranged in a 4×3 matrix manner at substantially the same level as the proper via-plugs. Namely, the four rows each having three metrical via-plugs 15A are arranged at the same pitch as the four columns each having the three metrical via-plugs 13A.

The positional offset measurement pattern unit 15 also includes two metrical interconnections 15B and 15C which are formed in the insulating interlayer 12 at substantially the same level as the proper interconnections. The metrical interconnection 15B has an elongated section $15B_1$ lying along the Y-axis of the X-Y coordinate system, and two strip-like sections $15B_2$ and $15B_3$ integrally extending from the elongated section $15B_1$ along the X-axis of the X-Y coordinate system. Similarly, the metrical interconnection 15C has an elongated section $15C_1$ lying along the Y-axis of the X-Y coordinate system, and two strip-like sections $15C_2$ and $15C_3$ integrally extending from the elongated section $15C_1$ along the X-axis of the X-Y coordinate system.

As shown in FIG. 3, the strip-like sections $15B_2$ and $15B_3$ and the strip-like sections $15C_2$ and $15C_3$ interdigitate with each other, i.e., are alternately arranged at the same pitch as the four rows each having three metrical via-plugs 15A, and each of the strip-like sections $15B_2$, $15C_2$, $15B_3$ and $15C_3$ is electrically connected to the three metrical via-plugs 15A included in the corresponding row. Note that the metrical via-plugs 15A have a smaller size than a width of the strip-like section $15B_2$, $15C_2$, $15B_3$ and $15C_3$.

The positional offset measurement pattern unit 15 further includes two electrode pads 15D and 15E which are formed in the insulating interlayer 12 at substantially the same level as the proper interconnections, and which are electrically connected to the elongated sections $15B_1$ and $15C_1$ of the respective metrical interconnections 15B and 15C.

As shown in FIG. 9A which is a partially-enlarged plan view showing a part of the positional offset measurement pattern unit 15 of FIG. 3, when the proper via-plugs and the proper interconnections are correctly arranged with respect to each other, the three metrical via-plugs 15A, which are electrically connected to the strip-like section $15B_2$, are arranged so that respective side faces of the three metrical via-plugs 15A concerned are coplanar with a side face of the strip-like section $15B_2$ which is defined as a plus Y-side face $PY_{15B2}$ with respect to a longitudinal central axis $L_{15B2}$ of the strip-like section $15B_2$. Note that the metrical via-plugs 15A concerned are merely formed as dummy via-plugs, and thus do not participate in the measurement of the positional offset between the arrangement of the proper via-plugs and the arrangement of the proper interconnections in the plus direction of the X-axis of the X-Y coordinate system.

The three metrical via-plugs 15A, which are electrically connected to the strip-like section $15C_2$, are arranged so that respective side faces of the three metrical via-plugs 15A concerned are coplanar with a side face of the strip-like section $15C_2$ which is defined as a plus Y-side face $PY_{15C2}$ with respect to a longitudinal central axis $L_{15C2}$ of the strip-like section $15C_2$, and are spaced apart by a distance "$d_a$" from a side face of the strip-like section $15B_2$ which is defined as a minus Y-side face $MY_{15B2}$ with respect to the longitudinal central axis $L_{15B2}$ of the strip-like section $15B_2$.

Similarly, the three metrical via-plugs 15A, which are electrically connected to the strip-like section $15B_3$, are arranged so that respective side faces of the three metrical via-plugs 15A concerned are coplanar with a side face of the strip-like section $15B_3$ which is defined as a plus Y-side face $PY_{15B3}$ with respect to a longitudinal central axis $L_{15B3}$ of the strip-like section $15B_3$, and are spaced apart by a distance "$d_a$" from a side face of the strip-like section $15C_2$ which is defined as a minus Y-side face $MY_{15C2}$ with respect to the longitudinal central axis $L_{15C2}$ of the strip-like section $15C_2$.

Further, the three metrical via-plugs 15A, which are electrically connected to the strip-like section $15C_3$, are arranged so that respective side faces of the three metrical via-plugs 15A concerned are coplanar with a side face of the strip-like section $15C_3$ which is defined as a plus Y-side face $PY_{15C3}$ with respect to a longitudinal central axis $L_{15C3}$ of the strip-like section $15C_3$, and are spaced apart by a distance "$d_a$" from a side face of the strip-like section $15B_3$ which is defined as a minus Y-side face $MY_{15B3}$ with respect to the longitudinal central axis $L_{15B3}$ of the strip-like section $15B_3$.

In FIG. 9B which is a cross-sectional view taken along the B-B line of FIG. 9A, as stated above, the insulating interlayer 17, having the proper via-plugs (not shown) and the proper interconnections (not shown) formed therein, is formed above the semiconductor substrate (not shown) prior to the formation of the insulating interlayer 12, and the cap layer or etching stopper layer 18 is formed on the insulating interlayer 17.

Usually, although each of the metrical via-plugs 15A is defined as extending from the top surface of the insulating interlayer 17 to the bottom surface of the corresponding metrical interconnection $15B_2$, $15C_2$, $15B_3$ or $15C_3$, it may be regarded as extending from the top surface of the insulating interlayer 17 to the top surface of the insulating interlayer 12. In this sense, it can be said that the three sets of three metrical via-plugs 15A, which are electrically connected to the respective strip-like sections $15C_2$, $15B_3$ and $15C_3$, confront the minus Y-side faces $MY_{15B2}$, $MY_{15C2}$ and $MY_{15B3}$ of the respective strip-like sections $15B_2$, $15C_2$ and $15B_3$.

Figure 10A:
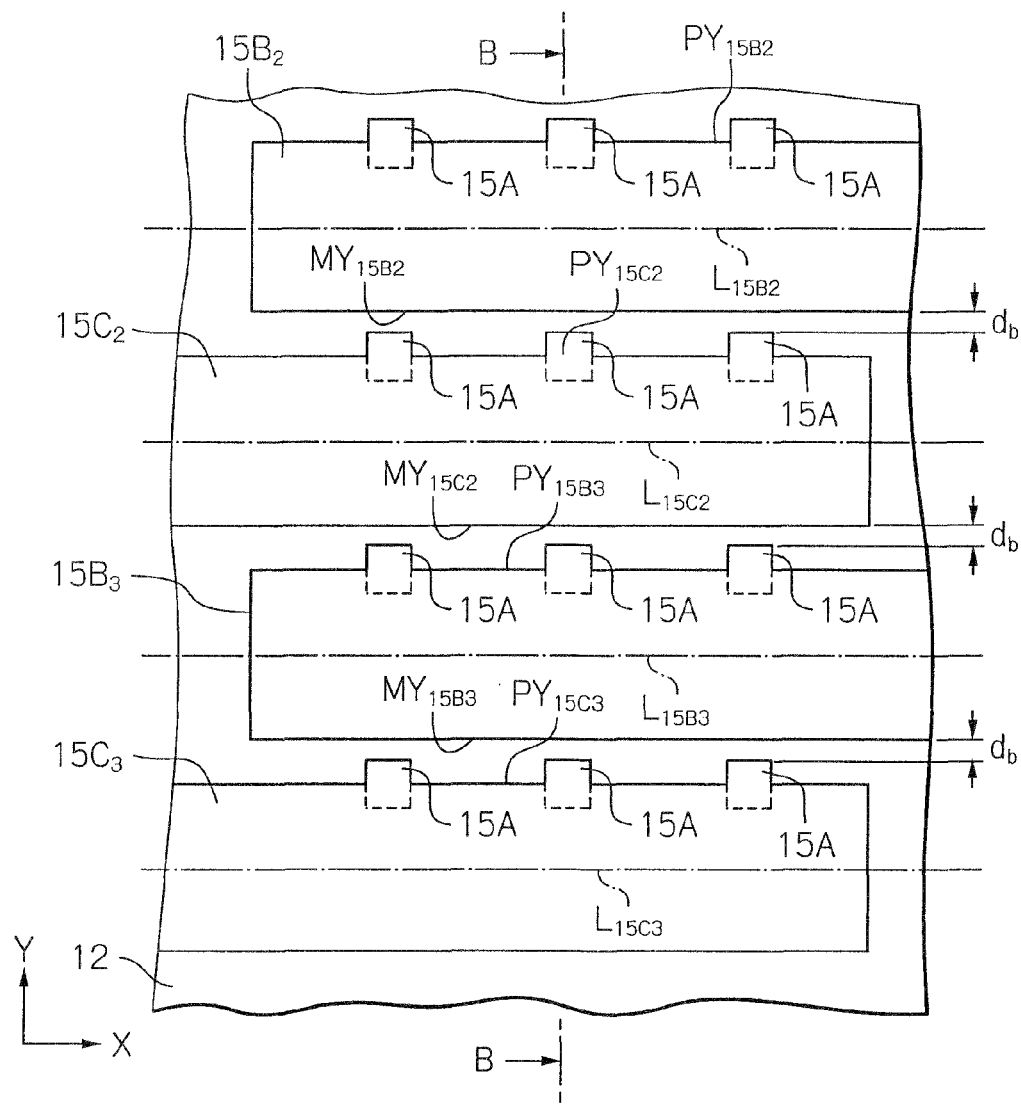
FIG. 10A is a partially-enlarged plan view, corresponding to FIG. 9A, in which the metrical via-plugs of FIG. 9A are shifted from the metrical interconnections of FIG. 9A in a plus direction of the Y-axis of the X-Y coordinate system.
Figure 10B:
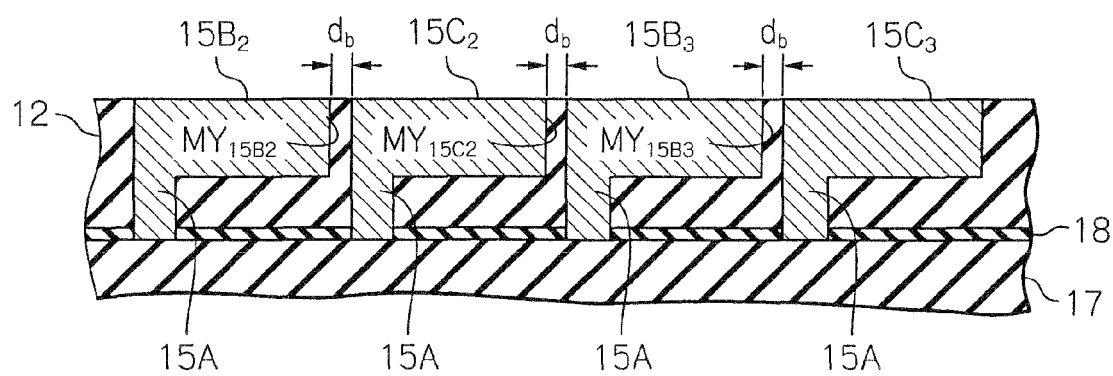
FIG. 10B is a cross-sectional view taken along the B-B line of FIG. 10A.

As shown in FIGS. 10A and 10B corresponding to FIGS. 9A and 9B, respectively, for example, when the proper via-plugs are offset from the proper interconnections in the plus direction of the Y-axis of the X-Y coordinate system, the three sets of three metrical via-plugs 15A, which are electrically connected to the respective strip-like sections $15C_2$, $15B_3$ and $15C_3$, are shifted toward the minus Y-side faces $MY_{15B3}$, $MY_{15C2}$ and $MY_{15B3}$ of the respective strip-like sections $15B_2$, $15C_2$ and $15B_3$ in accordance with the positional offset between the arrangement of the proper via-plugs and the arrangement of the proper interconnections, and thus the distances "$d_a$" (see: FIGS. 9A and 9B) are reduced to distances "$d_b$" (see: FIGS. 10A and 10B).

When the positional offset between the arrangement of the proper via-plugs and the arrangement of the proper interconnections in the plus direction of the Y-axis of the X-Y coordinate system is measured by using the positional offset measurement pattern unit 15, a voltage is applied between the electrode pads 15D and 15E, and is gradually stepped up until a breakdown occurs between the three sets of three metrical via-plugs 15A and the minus Y-side faces $MY_{15B2}$, $MY_{15C2}$ and $MY_{15B3}$ of the respective strip-like section $15B_2$, $15C_2$ and $15B_3$.

Of course, the breakdown voltage, which is measured when the three sets of three metrical via-plugs 15A are spaced apart from the respective minus Y-side faces $MY_{15B2}$, $MY_{15C2}$ and $MY_{15B3}$ of the respective strip-like section $15B_2$, $15C_2$ and $15B_3$ by the distance "$d_a$" (see: FIGS. 9A and 9B), is larger than the breakdown voltage which is measured when the three sets of three metrical via-plugs 15A are spaced apart from the respective minus Y-side faces $MY_{15B2}$, $MY_{15C2}$ and $MY_{15B3}$ of the respective strip-like section $15B_2$, $15C_2$ and $15B_3$ by the distance "$d_b$" (see: FIGS. 10A and 10B).

Thus, similar to the case of the positional offset measurement pattern unit 3, when a distance between the three sets of three metrical via-plugs 15A and the respective minus Y-side faces $MY_{15B2}$, $MY_{15C2}$ and $MY_{15B3}$ of the respective strip-like section $15B_2$, $15C_2$ and $15B_3$ is defined as a variable "d" representing a positional offset in the plus direction of the Y-axis of the X-Y coordinate system between the arrangement of the proper via-plugs and the arrangement of the interconnections, and when a breakdown voltage measured therebetween is defined as a variable "V", it is possible to represent the relationship between the variable or distance "d" and the variable or breakdown voltage "V" by the graph of FIG. 6.

Referring again to FIG. 3, the positional offset measurement pattern unit 16 is provided for measuring a positional offset between the arrangement of the proper via-plugs and the arrangement of the proper interconnections in the minus direction of the Y-axis of the X-Y coordinate system.

The positional offset measurement pattern unit 16 includes a plurality of metrical via-plugs 16A having the same size as the via-plugs 13A, and the metrical via-plugs 16A are formed in the insulating interlayer 12 so as to be arranged in a 4×3 matrix manner at substantially the same level as the proper via-plugs. Namely, the four rows each having three metrical via-plugs 16A are arranged at the same pitch as the four columns each having the three metrical via-plugs 13A.

The positional offset measurement pattern unit 16 also includes two metrical interconnections 16B and 16C which are formed in the insulating interlayer 12 at substantially the same level as the proper interconnections. The metrical interconnection 16B has an elongated section $16B_1$ lying along the Y-axis of the X-Y coordinate system, and two strip-like sections $16B_2$ and $16B_3$ integrally extending from the elongated section $16B_1$ along the X-axis of the X-Y coordinate system. Similarly, the metrical interconnection 16C has an elongated section $16C_1$ lying along the Y direction of the X-Y coordinate system, and two strip-like sections $16C_2$ and $16C_3$ integrally extending from the elongated section $16C_1$ along the X-axis of the X-Y coordinate system.

As shown in FIG. 3, the strip-like sections $16B_2$ and $16B_3$ and the strip-like sections $16C_2$ and $16C_3$ interdigitate with each other, i.e., are alternately arranged at the same pitch as the four rows each having three metrical via-plugs 16A, and each of the strip-like sections $16B_2$, $16C_2$, $16B_3$ and $16C_3$ is electrically connected to the three metrical via-plugs 16A included in the corresponding row. Note that the metrical via-plugs 16A have a smaller size than a width of the strip-like section $16B_2$, $16C_2$, $16B_3$ and $16C_3$.

The positional offset measurement pattern unit 16 further includes two electrode pads 16D and 16E which are formed in the insulating interlayer 12 at substantially the same level as the proper interconnections, and which are electrically connected to the elongated sections $16B_1$ and $16C_1$ of the respective metrical interconnections 16B and 16C.

Figure 11A:
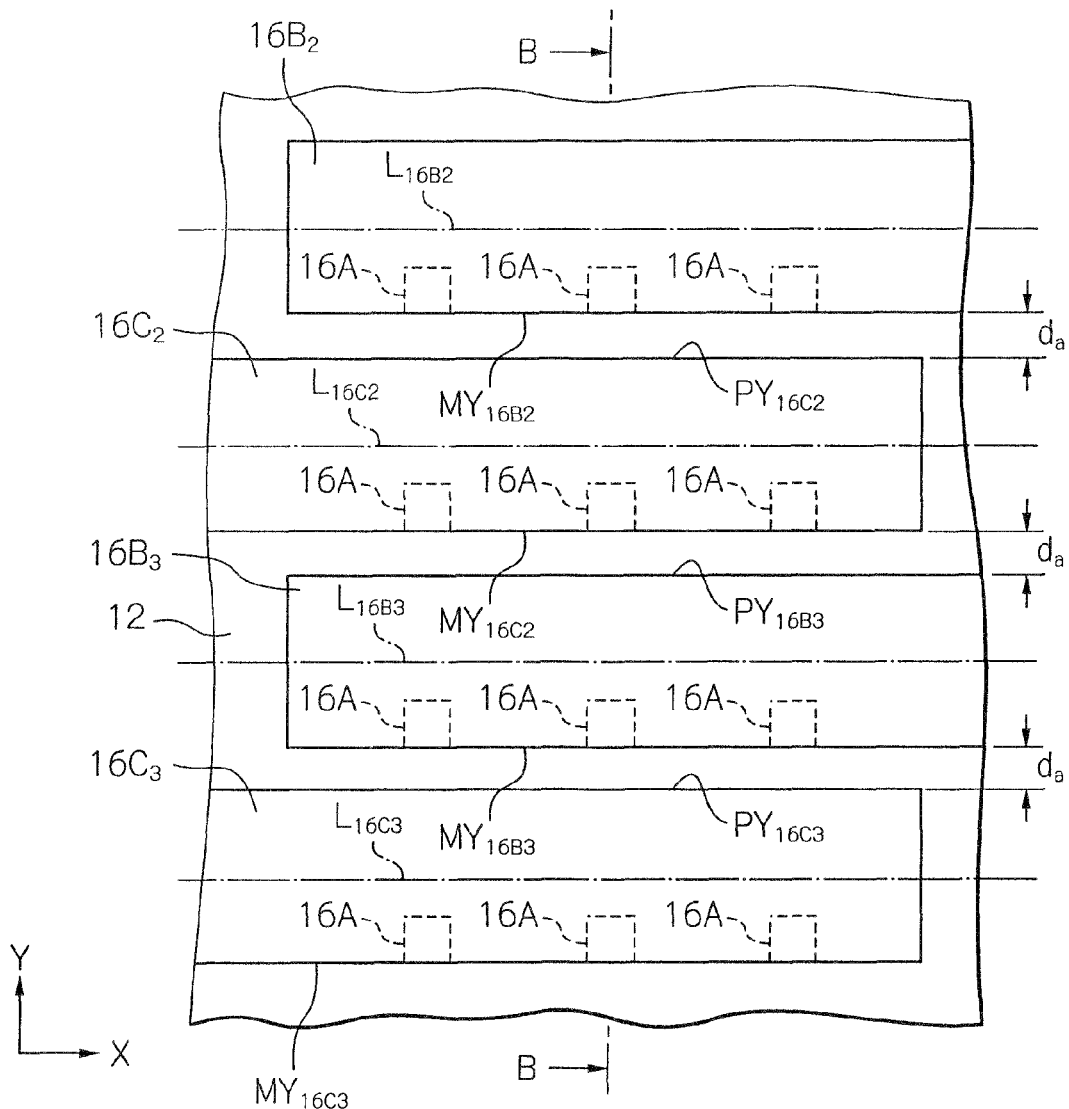
FIG. 11A is a partially-enlarged plan view showing the remaining one of the four positional offset measurement pattern units of FIG. 3.

As shown in FIG. 11A which is a partially-enlarged plan view showing a part of the positional offset measurement pattern unit 16 of FIG. 3, when the proper via-plugs and the proper interconnections are correctly arranged with respect to each other, the three metrical via-plugs 16A, which are electrically connected to the strip-like section $16B_2$, are arranged so that respective side faces of the three metrical via-plugs 16A concerned are coplanar with a side face of the strip-like section $16B_2$ which is defined as a minus Y-side face $MY_{16B2}$ with respect to a longitudinal central axis $L_{16B2}$ of the strip-like section $16B_2$, and are spaced apart by a distance "$d_a$" from a side face of the strip-like section $16C_2$ which is defined as a plus Y-side face $PY_{16C2}$ with respect to a longitudinal central axis $L_{16C2}$ of the strip-like section $16C_2$.

Similarly, the three metrical via-plugs 16A, which are electrically connected to the strip-like section $16C_2$, are arranged so that respective side faces of the three metrical via-plugs 16A concerned are coplanar with a side face of the strip-like section $16C_2$ which is defined as a minus Y-side face $MY_{16C2}$ with respect to the longitudinal central axis $L_{16C2}$ of the strip-like section $16C_2$, and are spaced apart by a distance "$d_a$" from a side face of the strip-like section $16B_3$ which is defined as a plus Y-side face $PY_{16B3}$ with respect to a longitudinal central axis $L_{16B3}$ of the strip-like section $16B_3$.

Further, the three metrical via-plugs 16A, which are electrically connected to the strip-like section $16B_3$, are arranged so that respective side faces of the three metrical via-plugs 16A concerned are coplanar with a side face of the strip-like section $16B_3$ which is defined as a minus Y-side face $MY_{16B3}$ with respect to the longitudinal central axis $L_{16B3}$ of the strip-like section $16B_3$, and are spaced apart by a distance "$d_a$" from a side face of the strip-like section $16C_3$ which is defined as a plus Y-side face $MX_{16C3}$ with respect to a longitudinal central axis $L_{16C3}$ of the strip-like section $16C_3$.

Although the three metrical via-plugs 16A, which are electrically connected to the strip-like section $16C_3$, are also arranged so that respective side faces of the three metrical via-plugs 16A concerned are coplanar with a side face of the strip-like section $16C_3$ which is defined as a minus Y-side face $MY_{16C3}$ with respect to the longitudinal central axis $L_{16C3}$ of the strip-like section $16C_3$, the metrical via-plugs 16A concerned are merely formed as dummy via-plugs, and thus do not participate in the measurement of the positional offset between the arrangement of the proper via-plugs and the arrangement of the proper interconnections in the minus direction of the Y-axis of the X-Y coordinate system.

Figure 11B:
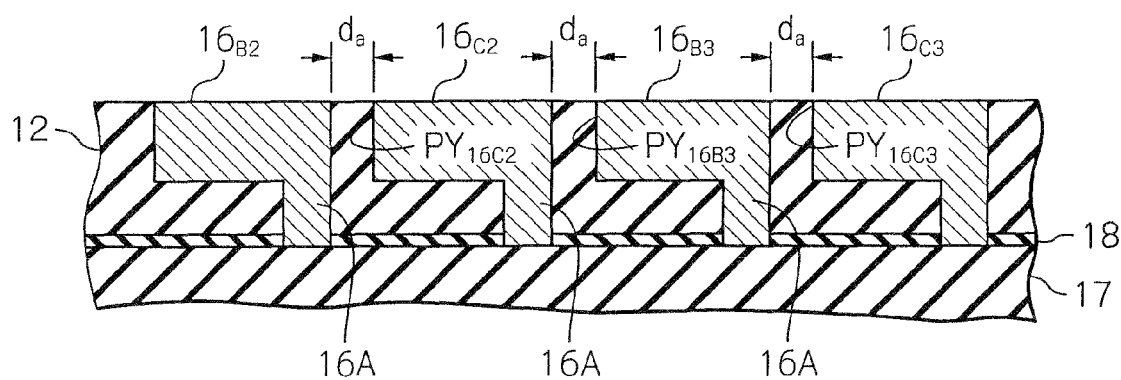
FIG. 11B is a cross-sectional view taken along the B-B line of FIG. 11A.

In FIG. 11B which is a cross-sectional view taken along the B-B line of FIG. 11A, as stated above, the insulating interlayer 17, having the proper via-plugs (not shown) and the proper interconnections (not shown) formed therein, is formed above the semiconductor substrate (not shown) prior to the formation of the insulating interlayer 12, and the cap layer or etching stopper layer 18 is formed on the insulating interlayer 17.

Usually, although each of the metrical via-plugs 16A is defined as extending from the top surface of the insulating interlayer 17 to the bottom surface of the corresponding metrical interconnection $16B_2$, $16C_2$, $16B_3$ or $16C_3$, it may be regarded as extending from the top surface of the insulating interlayer 17 to the top surface of the insulating interlayer 12. In this sense, it can be said that the three sets of three metrical via-plugs 16A, which are electrically connected to the respective strip-like sections $16B_2$, $16C_2$ and $16B_3$, confront the plus Y-side faces $PY_{16C2}$, $MY_{16B3}$ and $MY_{16C3}$ of the respective strip-like sections $16C_2$, $16B_3$ and $16C_3$.

Figure 12A:
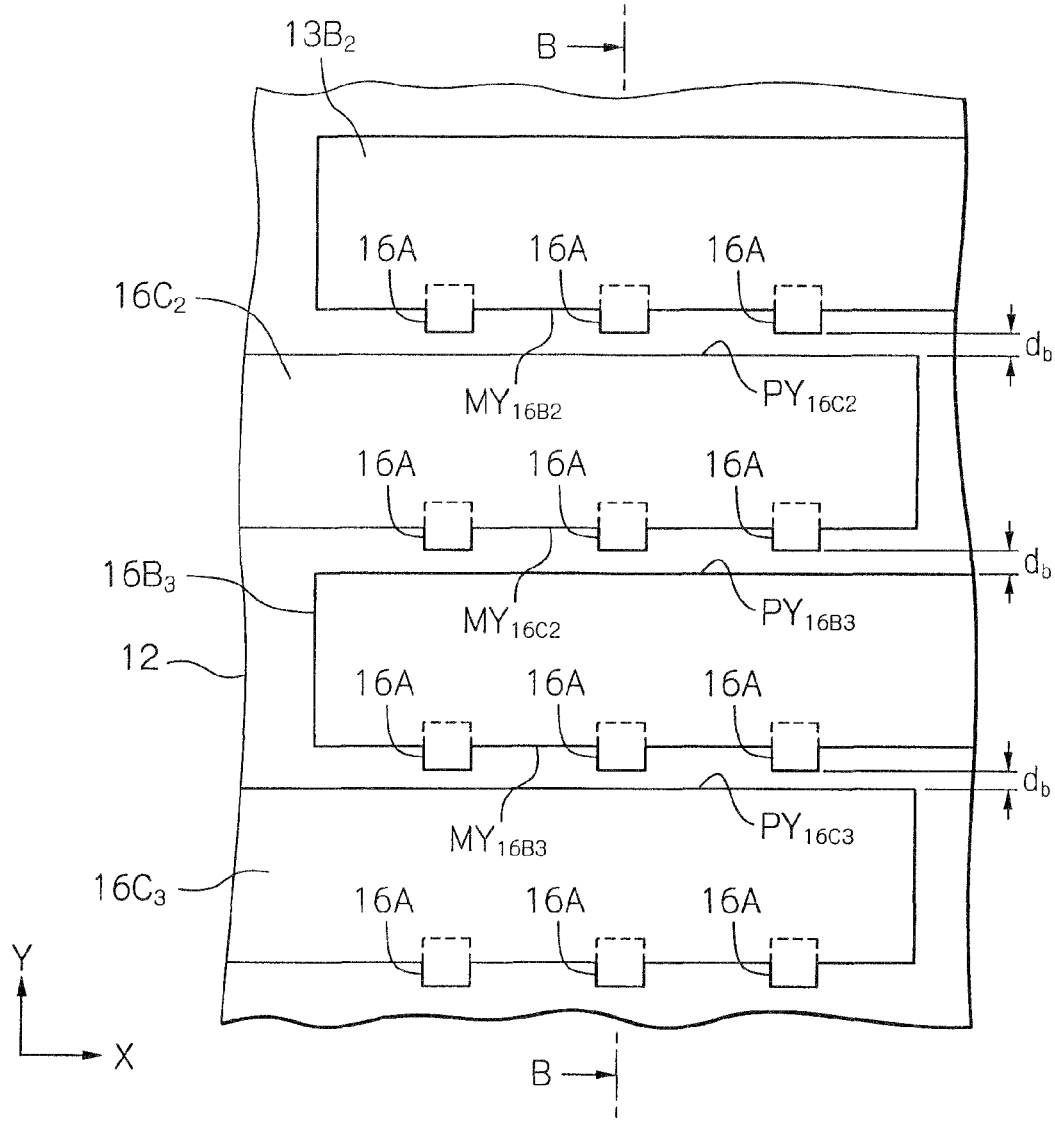
FIG. 12A is a partially-enlarged plan view, corresponding to FIG. 11A, in which the metrical via-plugs of FIG. 11A are shifted from the metrical interconnections of FIG. 11A in a minus direction of the Y-axis of the X-Y coordinate system.
Figure 12B:
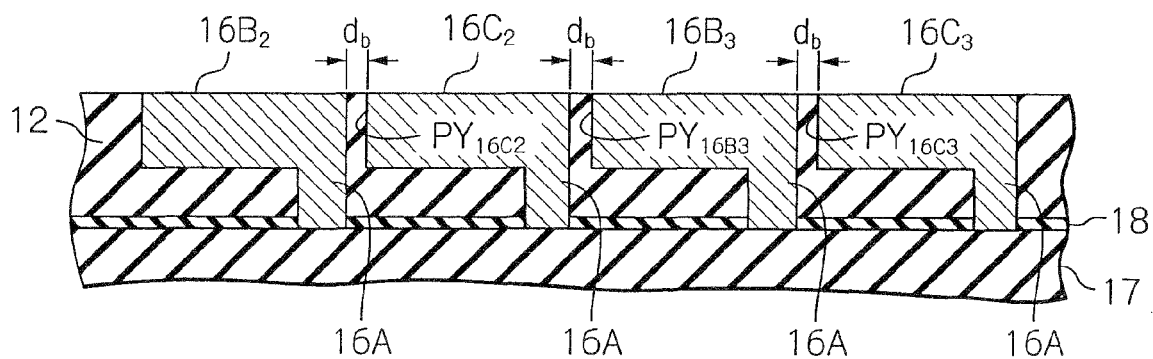
FIG. 12B is a cross-sectional view taken along the B-B line of FIG. 12A.

As shown in FIGS. 12A and 12B corresponding to FIGS. 11A and 11B, respectively, for example, when the proper via-plugs are offset from the proper interconnections in the minus direction of the Y-axis of the X-Y coordinate system, the three sets of three metrical via-plugs 16A, which are electrically connected to the respective strip-like sections $16B_2$, $16C_2$ and $16B_3$, are shifted toward the plus Y-side faces $PY_{16C2}$, $MY_{16B3}$ and $MY_{16C3}$ of the respective strip-like sections $16C_2$, $16B_3$ and $16C_3$ in accordance with the positional offset between the arrangement of the proper via-plugs and the arrangement of the proper interconnections, and thus the distances "$d_a$" (see: FIGS. 11A and 11B) are reduced to distances "$d_b$" (see: FIGS. 12A and 12B).

When the positional offset between the arrangement of the proper via-plugs and the arrangement of the proper interconnections in the minus direction of the Y-axis of the X-Y coordinate system is measured by using the positional offset measurement pattern unit 16, a voltage is applied between the electrode pads 16D and 16E, and is gradually stepped up until a breakdown occurs between the three sets of three metrical via-plugs 16A and the plus Y-side faces $PY_{16C2}$, $MY_{16B3}$ and $MY_{16C3}$ of the respective strip-like sections $16C_2$, $16B_3$ and $16C_3$.

Of course, the breakdown voltage, which is measured when the three sets of three metrical via-plugs 16A are spaced apart from the respective plus Y-side faces $PY_{16C2}$, $MY_{16B3}$ and $MY_{16C3}$ of the respective strip-like sections $16C_2$, $16B_3$ and $16C_3$ by the distance "$d_a$" (see: FIGS. 11A and 11B), is larger than the breakdown voltage which is measured when the three sets of three metrical via-plugs 16A are spaced apart from the respective plus Y-side faces $PY_{16C2}$, $MY_{16B3}$ and $MY_{16C3}$ of the respective strip-like sections $16C_2$, $16B_3$ and $16C_3$ by the distance "$d_b$" (see: FIGS. 12A and 12B).

Thus, similar to the case of the positional offset measurement pattern unit 13, when a distance between the three sets of three metrical via-plugs 16A and the respective plus Y-side faces $PY_{16C2}$, $MY_{16B3}$ and $MY_{16B3}$ of the respective strip-like sections $16C_2$, $16B_3$ and $16C_3$ is defined as a variable "d" representing a positional offset in the plus direction of the Y-axis of the X-Y coordinate system between the arrangement of the proper via-plugs and the arrangement of the interconnections, and when a breakdown voltage measured therebetween is defined as a variable "V", it is possible to represent the relationship between the variable or distance "d" and the variable or breakdown voltage "V" by the graph of FIG. 6.

Note, in FIG. 3, although the positional offset measurement pattern units 13, 14, 15 and 16 are formed in the suitable margin area of the insulating interlayer 12, these units 13, 14, 15 and 16 may be discretely formed in respective four margin areas such as corner areas of the insulating interlayer 12.

Figure 13:
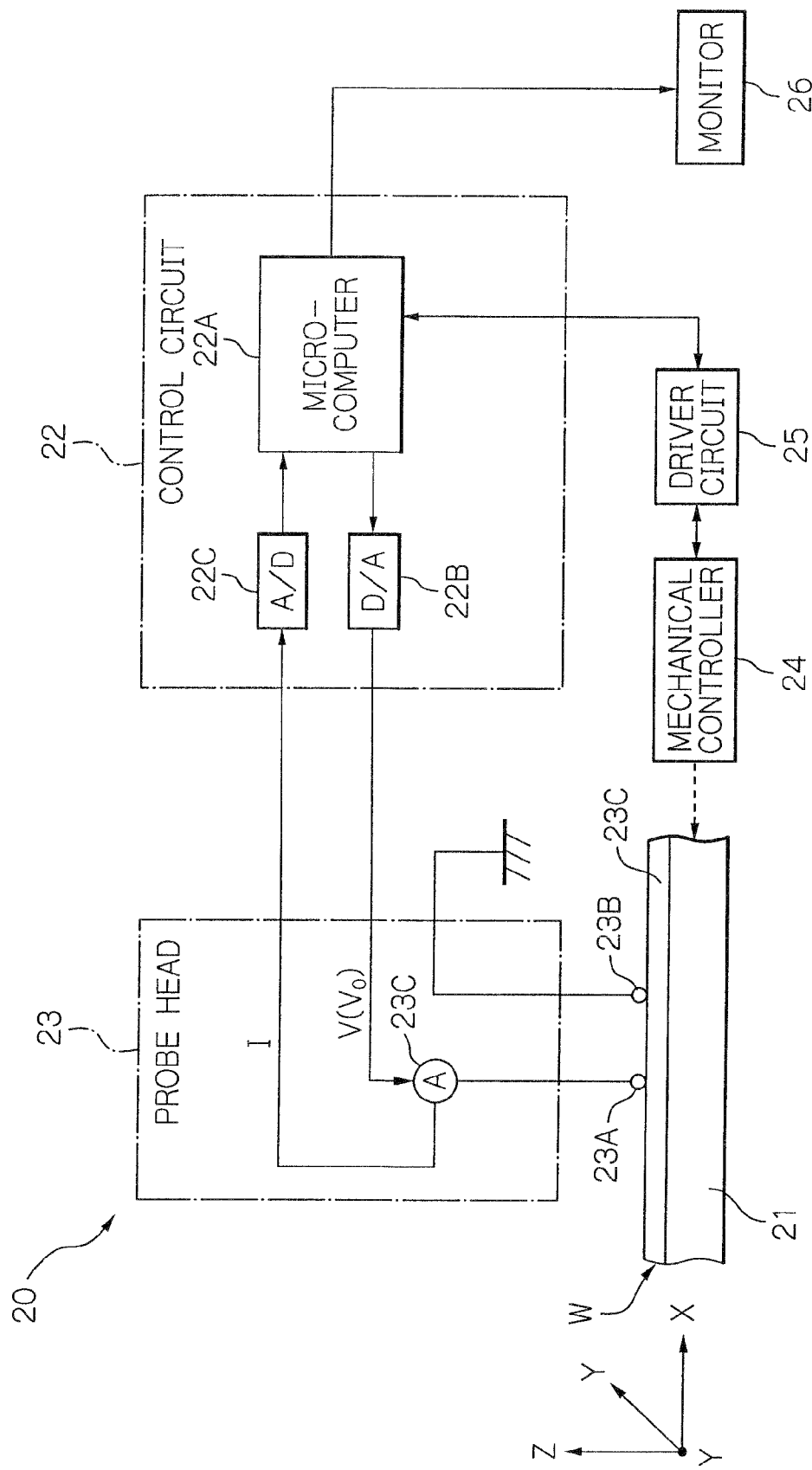
FIG. 13 is a block diagram of a positional offset measurement apparatus for measuring positional offsets between the arrangement of the proper via-plugs and the arrangement of the proper interconnections by using the positional offset measurement pattern units of FIG. 3.

With reference to FIG. 13 which is a block diagram of a positional offset measurement apparatus for measuring the positional offset between the arrangement of the proper via-plugs and the arrangement of the proper interconnections by using the positional offset measurement pattern units 13, 14, 15 and 16 of FIG. 3, the positional offset measurement apparatus is generally indicated by reference numeral 20.

The positional offset measurement apparatus 20 includes a movable wafer stage 21 which is constituted so as to be three-dimensionally movable along X-, Y- and Z-axes of an X-Y-Z coordinate system defined in the positional offset measurement apparatus 20, and which is rotatable around a vertical central axis thereof. A semiconductor wafer W, having a plurality of semiconductor devices 10 (see: FIG. 3) produced therein, is detachably mounted on the movable wafer stage 21.

Also, the positional offset measurement apparatus 20 includes a control circuit 22 which contains a microcomputer 22A having a central processing unit (CPU), a read-only memory (ROM) for storing various programs, constants and so on, a random-access memory (RAM) for storing temporary data, an input/output (I/O) interface circuit and so on. The control circuit 22 also has a digital-to-analog (D/A) converter 22B, an input terminal of which is connected to the I/O interface circuit of the microcomputer 22A, and an analog-to-digital (A/D) converter 22C, an output terminal of which is connected to the I/O interface circuit of the microcomputer 22A.

The positional offset measurement apparatus 20 further includes a probe head 23 having a pair of probe terminals 23A and 23B which are arranged so as to be contacted with the electrode pads 13D and 13E, 14D and 14E, 15D and 15E or 16D and 16E (see: FIG. 3). The probe head 23 also has a current detector 23C, and the probe terminal 23A is connected to an output terminal of the D/A converter 22B through the current detector 23C, with the probe terminal 23B being grounded. The current detector 23C has an output terminal connected to an input terminal of the A/D converter 23C.

The positional offset measurement apparatus 20 further includes a mechanical controller 24 which is mechanically connected to the movable wafer stage 21 for controlling the three-dimensional movement and the rotational movement of the movable wafer stage 21, and a driver circuit 25 for operating the mechanical controller 24 under control of the control circuit 22, whereby the contact of the probe terminals 23A and 23B with the electrode pads 13D and 13E, 14D and 14E, 15D and 15E or 16D and 16E (see: FIG. 3) can be ensured.

Note that, in FIG. 13, the mechanical connection of the mechanical controller 24 to the movable stage 21 is represented by an arrow-headed broken line.

The positional offset measurement apparatus 20 further includes a monitor 26 such as a liquid display panel for displaying measurement results, various data and so on.

In operation of the positional offset measurement apparatus 20, the probe terminals 23A and 23B are contacted with, for example, the respective electrode pads 13D and 13E (see: FIG. 3) by suitably driving the movable wafer stage 21 under control of the mechanical controller 24. Then, a given initial voltage "$V_0$" is output as a voltage "V" from the D/A converter 33B to the electrode pad 13D, and then is gradually stepped up under control of the control circuit 22 until a breakdown occurs between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$ (see: FIGS. 4A and 4B and FIGS. 5A and 5B).

When the breakdown occurs, a current "I" flows between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$, and is detected by the current detector 23C. The current "I" is output from the current detector 23C to the A/D converter 22C, and is fetched as a digital signal by the microcomputer 22A.

When the digital signal is fetched by the microcomputer 22A, the last stepped-up voltage "V" is determined as a breakdown voltage. Then, a distance "d" between the three sets of three metrical via-plugs 13A and the minus X-side faces $MX_{13C2}$, $MX_{13B3}$ and $MX_{13C3}$, of the respective strip-like section $13C_2$, $13B_3$ and $13C_3$ (see: FIGS. 4A and 4B and FIGS. 5A and 5B) is calculated based on the breakdown voltage "V" by using the graph of FIG. 6.

Figure 14:
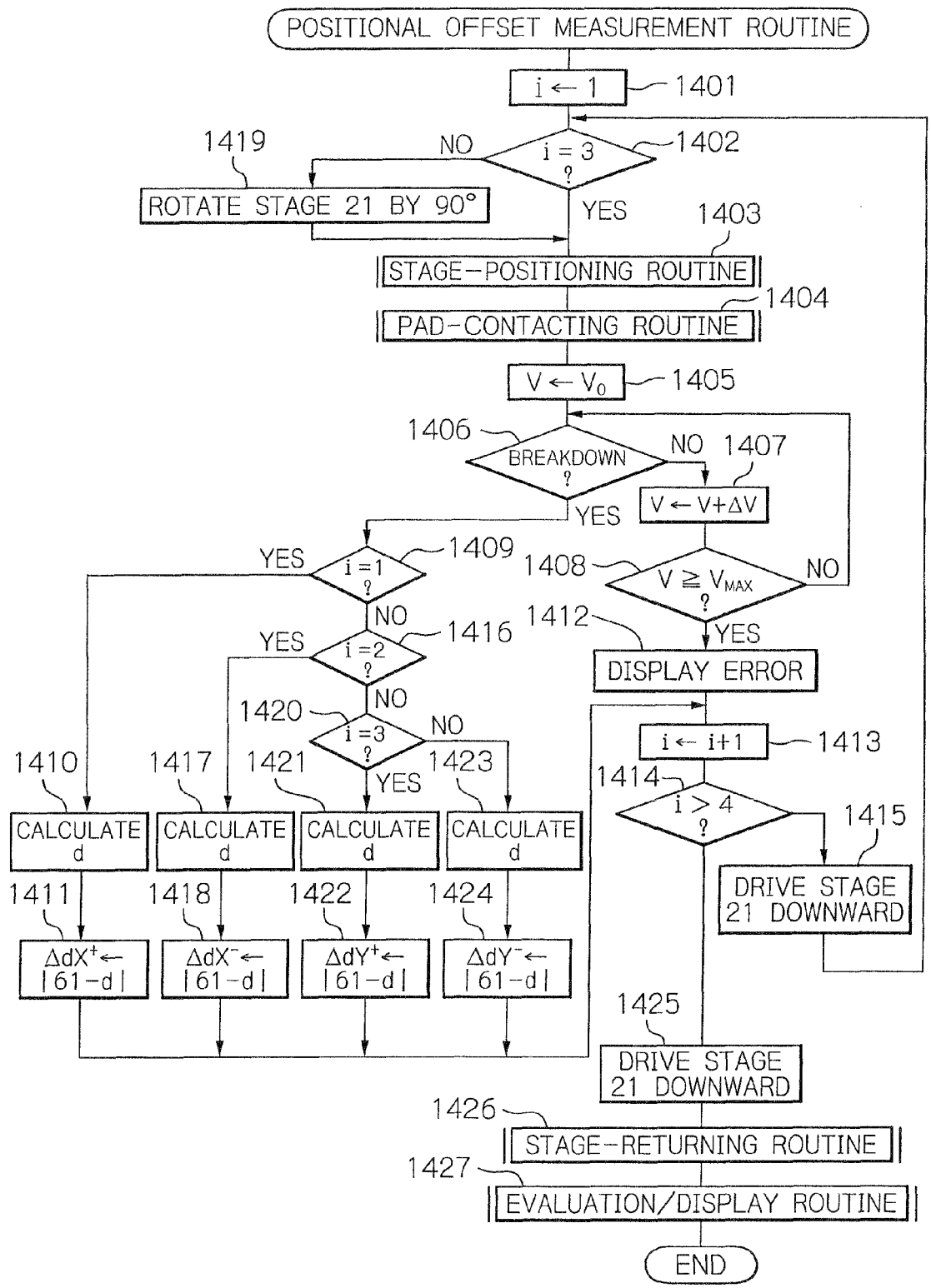
FIG. 14 is a flowchart of a positional offset measurement routine executed in a microcomputer of FIG. 13.

With reference to FIG. 14 which is a flowchart of a positional offset measurement routine executed in the microcomputer 22A of FIG. 13, a positional offset measurement method according to the present invention will now be explained below.

Note, whenever the positional offset measurement routine of FIG. 14 is carried out, four measurements are carried out by using the respective positional offset measurement pattern units 13, 14, 15 and 16 (see: FIG. 3) in order.

Also, note, before the positional offset measurement routine of FIG. 14 is executed, the movable wafer stage 21 (see:

FIG. 13) is oriented so that a line passing through both the center points of the electrode pads 13D and 13E or 14D and 14E (see: FIG. 3) is parallel to a line passing through the probe terminals 23A and 23B, and is placed below the probe terminals 23A and 23B.

At step 1401, a counter value "i" is initialized to be "1". Note that the counter value "i" is provided for counting how many times a measurement is carried out.

At step 1402, it is determined whether the counter value "i" is equal to "3". At this stage, since i=1, the control proceeds to step 1403, in which a stage-positioning routine is executed so that the wafer stage 21 (see: FIG. 13) is suitably driven by the mechanical controller 24 along both the X- and the Y-axes of the X-Y-Z coordinate system, to thereby position the electrode pads 13D and 13E of the positional offset measurement pattern unit 13 (see: FIG. 3) just beneath the probe terminals 23A and 23B of the probe unit 23.

Then, at step 1404, a pad-contacting routine is executed so that the wafer stage 21 is driven upward by the mechanical controller 24 until the electrode pads 13D and 13E of the positional offset measurement pattern unit 13 are contacted with the probe terminals 23A and 23B of the probe unit 23.

At step 1405, a given initial voltage "$V_0$" is output as the voltage "V" from the D/A converter 22B to the probe terminal 23A. Note that the initial voltage "$V_0$" may be 50 volts (see: FIG. 6). Then, at step 1406, it is determined whether a breakdown occurs between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$ (see: FIGS. 4A and 4B and FIGS. 5A and 5B) based on the current "I" output from the current detector 23C to the A/D converter 22C (see: FIG. 13).

At step 1406, if the occurrence of the breakdown is not confirmed, the control proceeds to step 1407, in which the voltage "V" is stepped up by a small voltage ΔV of, for example, less than 0.5 volts. Then, at step 1408, it is monitored whether the voltage "V" has reached a voltage $V_{MAX}$ which may be set to, for example, 64 volts (see: FIG. 6).

If $V<V_{MAX}$, the control returns to step 1406, and thus the routine comprising steps 1406, 1407 and 1408 is repeatedly executed so that the voltage "V" is gradually stepped up.

At step 1406, when the occurrence of the breakdown is confirmed, the control proceeds from 1406 to step 1409, in which it is determined whether the counter value "i" is equal to "1". At this stage, since i=1, the control proceeds to step 1410, the distance "d" between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$ (see: FIGS. 4A and 4B and FIGS. 5A and 5B) is calculated based on the last stepped-up voltage or breakdown voltage "V" by using the graph of FIG. 6.

Then, at step 1411, the following calculation is executed:

$$\Delta dX^+ \leftarrow |61-d|$$

The calculated result $\Delta dX^+$, which represents a positional offset amount between the arrangement of the proper via-plugs and the arrangement of the proper interconnections in the plus direction of the X-axis of the X-Y coordinate system, is temporarily stored in the RAM of the microcomputer 22A (see: FIG. 13).

On the other hand, at step 1408, when the voltage "V" has been stepped up to the voltage $V_{MAX}$ without the occurrence of the breakdown being confirmed at step 1406, the control proceeds from step 1408 to step 1412, in which an error message is displayed on the monitor 26 (see: FIG. 13) to announce that the positional offset measurement pattern unit 13 (see: FIG. 3) is abnormal and defective, because the breakdown must occur between the three sets of three metrical via-plugs 13A and the minus X-side faces $MX_{13C2}$, $MX_{13B3}$ and $MX_{13C3}$ of the respective strip-like section $13C_2$, $13B_3$ and $13C_3$ (see: FIGS. 4A and 4B and FIGS. 5A and 5B) when the voltage "V" exceeds the voltage of 59 volts (see: FIG. 6).

In either event, the control proceeds from either step 1411 or 1412 to step 1413, in which the counter value "i" is incremented by "1" (i=2). Then, at step 1414, it is monitored whether the counter value "i" has exceeded "4".

At this stage i=2, the control proceeds to step 1415, in which the wafer stage 21 (see: 13) is driven downward to a given level so that the probe terminals 23A and 23B are removed from the respective electrode pads 13D and 13E (see: FIG. 3). Then, the control returns to step 1402.

At step 1402, it is determined whether the counter value "i" is equal to "3". At this stage, since i=2, the control proceeds to step 1403, in which the stage-positioning routine is again executed so that the wafer stage 21 (see: FIG. 13) is suitably driven by the mechanical controller 24 along both the X- and the Y-axes of the X-Y-Z coordinate system, to thereby position the electrode pads 14D and 14E of the positional offset measurement pattern unit 14 just beneath the probe terminals 23A and 23B of the probe unit 23.

Then, at step 1404, the pad-contacting routine is again executed so that the wafer stage 21 is driven upward by the mechanical controller 24 until the electrode pads 14D and 14E of the positional offset measurement pattern unit 14 are contacted with the probe terminals 23A and 23B of the probe unit 23.

At step 1405, the given initial voltage "$V_0$" is again output as the voltage "V" from the D/A converter 22B to the probe terminal 23A. Note, as already stated, the initial voltage "$V_0$" may be 50 volts (see: FIG. 6). Then, at step 1406, it is determined whether a breakdown occurs between the three sets of three metrical via-plugs 14A and the minus X-side faces $PX_{14B2}$, $PX_{14C2}$ and $MX_{14B3}$ of the respective strip-like section $14B_2$, $14C_2$ and $14B_3$ (see: FIGS. 7A and 7B and FIGS. 8A and 8B) based on the current "I" output from the current detector 23C to the A/D converter 22C (see: FIG. 13).

At step 1406, if the occurrence of the breakdown is not confirmed, the control proceeds to step 1407, in which the voltage "V" is stepped up by the small voltage ΔV of, for example, less than 0.5 volts. Then, at step 1408, it is monitored whether the voltage "V" has reached the voltage $V_{MAX}$ which may be set to, for example, 64 volts (see: FIG. 6).

If $V<V_{MAX}$, the control returns to step 1406, and thus the routine comprising steps 1406, 1407 and 1408 is repeatedly executed so that the voltage "V" is gradually stepped up.

At step 1406, when the occurrence of the breakdown is confirmed, the control proceeds from 1406 to step 1409, in which it is determined whether the counter value "i" is equal to "1". At this stage, since i=2, the control proceeds to step 1416, in which it is determined whether the counter value "i" is equal to "2". Thus, the control proceeds to step 1417 due to i=2. At step 1417, the distance "d" between the three sets of three metrical via-plugs 14A and the minus X-side faces $PX_{14B2}$, $PX_{14C2}$ and $MX_{14B3}$ of the respective strip-like section $14B_2$, $14C_2$ and $14B_3$ (see: FIGS. 7A and 7B and FIGS. 8A and 8B) is calculated based on the last stepped-up voltage or breakdown voltage "V") by using the graph of FIG. 6.

Then, at step 1418, the following calculation is executed:

$$\Delta dX^- \leftarrow |61-d|$$

The calculated result $\Delta dX^-$, which represents a positional offset amount between the arrangement of the proper via-plugs and the arrangement of the proper interconnections in the minus direction of the X-axis of the X-Y coordinate system, is temporarily stored in the RAM of the microcomputer 22A (see: FIG. 13).

On the other hand, at step 1408, when the voltage "V" has been stepped up to the voltage $V_{MAX}$ without the occurrence of the breakdown being confirmed at step 1406, the control proceeds from step 1408 to step 1412, in which an error message is displayed on the monitor 26 (see: FIG. 13) to announce that the positional offset measurement pattern unit 14 (see: FIG. 3) is abnormal and defective, because the breakdown must occur between the three sets of three metrical via-plugs 14A and the minus X-side faces $PX_{14B2}$, $PX_{14C2}$ and $MX_{14B3}$ of the respective strip-like section $14B_2$, $14C_2$ and $14B_3$ (see: FIGS. 7A and 7B and FIGS. 8A and 8B) when the voltage "V" exceeds the voltage of 59 volts (see: FIG. 6).

In either event, the control proceeds from either step 1418 or 1412 to step 1413, in which the counter value "i" is incremented by "1" (i=3). Then, at step 1414, it is monitored whether the counter value "i" has exceeded "4". At this stage, i=3, the control proceeds to step 1415, in which the wafer stage 21 (see: 13) is driven downward to the given level so that the probe terminals 23A and 23B are removed from the respective electrode pads 14D and 14E (see: FIG. 3). Then, the control returns to step 1402.

At step 1402, it is determined whether the counter value "i" is equal to "3". At this stage, since i=3, the control proceeds to step 1419, in which the wafer stage 21 (see: FIG. 13) is rotated around the vertical central axis thereof by an angle of, for example, +90 degrees.

Then, the control proceeds to step 1403, in which the stage-positioning routine is again executed so that the wafer stage 21 is suitably driven by the mechanical controller 24 along both the X- and the Y-axes of the X-Y-Z coordinate system, to thereby position the electrode pads 15D and 15E of the positional offset measurement pattern unit 15 (see: FIG. 3) just beneath the probe terminals 23A and 23B of the probe unit 23 (see: FIG. 13).

Then, at step 1404, the pad-contacting routine is again executed so that the wafer stage 21 is driven upward by the mechanical controller 24 until the electrode pads 15D and 15E of the positional offset measurement pattern unit 15 are contacted with the probe terminals 23A and 23B of the probe unit 23.

At step 1405, the given initial voltage "$V_0$" is again output as the voltage "V" from the D/A converter 22B to the probe terminal 23A. Note, as already stated, the initial voltage "$V_0$" may be 50 volts (see: FIG. 6). Then, at step 1406, it is determined whether a breakdown occurs between the three sets of three metrical via-plugs 15A and the minus X-side faces $MY_{15B2}$, $MY_{15C2}$ and $MY_{15B3}$ of the respective strip-like section $15B_2$, $15C_2$ and $15B_3$ (see: FIGS. 9A and 9B and FIGS. 10A and 10B) based on the current "I" output from the current detector 23C to the A/D converter 22C (see: FIG. 13).

At step 1406, if the occurrence of the breakdown is not confirmed, the control proceeds to step 1407, in which the voltage "V" is stepped up by the small voltage ΔV of, for example, less than 0.5 volts. Then, at step 1408, it is monitored whether the voltage "V" has reached the voltage $V_{MAX}$ which may be set to, for example, 64 volts (see: FIG. 6).

If $V<V_{MAX}$, the control returns to step 1406, and thus the routine comprising steps 1406, 1407 and 1408 is repeatedly executed so that the voltage "V" is gradually stepped up.

At step 1406, when the occurrence of the breakdown is confirmed, the control proceeds from 1406 to step 1409, in which it is determined whether the counter value "i" is equal to "1". At this stage, since i=3, the control proceeds to step 1416, in which it is determined whether the counter value "i"

is equal to "2". Due to i=3, the control further proceeds to step 1420, in which it is determined whether the counter value "i" is equal to "3".

Thus, the control proceeds from step 1420 to step 1421, in which the distance "d" between the three sets of three metrical via-plugs 15A and the minus X-side faces $MY_{15B2}$, $MY_{15c2}$ and $MY_{15B3}$ of the respective strip-like section $15B_2$, $15C_2$ and $15B_3$ (see: FIGS. 9A and 9B and FIGS. 10A and 10B) is calculated based on the last stepped-up voltage or breakdown voltage "V" by using the graph of FIG. 6.

Then, at step 1422, the following calculation is executed:

$$\Delta dY^+ \leftarrow |61-d|$$

The calculated result $\Delta dY^+$, which represents a positional offset amount between the arrangement of the proper via-plugs and the arrangement of the proper interconnections in the plus direction of the Y-axis of the X-Y coordinate system, is temporarily stored in the RAM of the microcomputer 22A (see: FIG. 13).

On the other hand, at step 1408, when the voltage "V" has been stepped up to the voltage $V_{MAX}$ without the occurrence of the breakdown being confirmed at step 1406, the control proceeds from step 1408 to step 1412, in which an error message is displayed on the monitor 26 (see: FIG. 13) to announce that the positional offset measurement pattern unit 15 (see: FIG. 3) is abnormal and defective, because the breakdown must occur between the three sets of three metrical via-plugs 15A and the minus X-side faces $MY_{15B2}$, $MY_{15C2}$ and $MY_{15B3}$ of the respective strip-like section $15B_2$, $15C_2$ and $15B_3$ (see: FIGS. 9A and 9B and FIGS. 10A and 10B) when the voltage "V" exceeds the voltage of 59 volts (see: FIG. 6).

In either event, the control proceeds from either step 1422 or 1412 to step 1413, in which the counter value "i" is incremented by "1" (i=4). Then, at step 1414, it is monitored whether the counter value "i" has exceeded "4". At this stage, i=4, the control proceeds to step 1415, in which the wafer stage 21 (see: 13) is driven downward to the given level so that the probe terminals 23A and 23B are removed from the respective electrode pads 15D and 15E (see: FIG. 3). Then, the control returns to step 1402.

At step 1402, it is determined whether the counter value "i" is equal to "3". At this stage, since i=4, the control proceeds step 1403, in which the stage-positioning routine is again executed so that the wafer stage 21 is suitably driven by the mechanical controller 24 along both the X- and the Y-axes of the X-Y-Z coordinate system, to thereby position the electrode pads 16D and 16E of the positional offset measurement pattern unit 16 (see: FIG. 3) just beneath the probe terminals 23A and 23B of the probe unit 23 (see: FIG. 13).

Then, at step 1404, the pad-contacting routine is again executed so that the wafer stage 21 is driven upward by the mechanical controller 24 until the electrode pads 16D and 16E of the positional offset measurement pattern unit 16 are contacted with the probe terminals 23A and 23B of the probe unit 23.

At step 1405, the given initial voltage "$V_0$" is again output as the voltage "V" from the D/A converter 22B to the probe terminal 23A. Note, as already stated, the initial voltage "$V_0$" may be 50 volts (see: FIG. 6). Then, at step 1406, it is determined whether a breakdown occurs between the three sets of three metrical via-plugs 16A and the minus X-side faces $PY_{16C2}$, $PY_{16B3}$ and $PY_{16C3}$ of the respective strip-like section $16C_2$, $16B_3$ and $16C_3$ (see: FIGS. 11A and 11B and FIGS. 12A and 12B) based on the current "I" output from the current detector 23C to the A/D converter 22C (see: FIG. 13).

At step 1406, if the occurrence of the breakdown is not confirmed, the control proceeds to step 1407, in which the voltage "V" is stepped up by the small voltage ΔV of, for example, less than 0.5 volts. Then, at step 1408, it is monitored whether the voltage "V" has reached the voltage $V_{MAX}$ which may be set to, for example, 64 volts (see: FIG. 6).

If $V<V_{MAX}$, the control returns to step 1406, and thus the routine comprising steps 1406, 1407 and 1408 is repeatedly executed so that the voltage "V" is gradually stepped up.

At step 1406, when the occurrence of the breakdown is confirmed, the control proceeds from 1406 to step 1409, in which it is determined whether the counter value "i" is equal to "1". At this stage, since i=4, the control proceeds to step 1416, in which it is determined whether the counter value "i" is equal to "2". Due to i=4, the control further proceeds to step 1420, in which it is determined whether the counter value "i" is equal to "3".

Thus, the control proceeds from step 1420 to step 1423, in which the distance "d" between the three sets of three metrical via-plugs 16A and the minus X-side faces $PY_{16C2}$, $PY_{16B3}$ and $PY_{16C3}$ of the respective strip-like section 16C₂, 16B₃ and 16C₃ (see: FIGS. 11A and 11B and FIGS. 12A and 12B) is calculated based on the last stepped-up voltage or breakdown voltage "V" by using the graph of FIG. 6.

Then, at step 1424, the following calculation is executed:

$$\Delta dY^- \leftarrow |61-d|$$

The calculated result $\Delta dY^-$, which represents a positional offset amount between the arrangement of the proper via-plugs and the arrangement of the proper interconnections in the minus direction of the Y-axis of the X-Y coordinate system, is temporarily stored in the RAM of the microcomputer 22A (see: FIG. 13).

On the other hand, at step 1408, when the voltage "V" has been stepped up to the voltage $V_{MAX}$ without the occurrence of the breakdown being confirmed at step 1406, the control proceeds from step 1408 to step 1412, in which an error message is displayed on the monitor 26 (see: FIG. 13) to announce that the positional offset measurement pattern unit 16 (see: FIG. 3) is abnormal and defective, because the breakdown must occur between the three sets of three metrical via-plugs 16A and the minus X-side faces $PY_{16C2}$, $PY_{16B3}$ and $PY_{16C3}$ of the respective strip-like section 16C₂, 16B₃ and 16C₃ (see: FIGS. 11A and 11B and FIGS. 12A and 12B) when the voltage "V" exceeds the voltage of 59 volts (see: FIG. 6).

In either event, the control proceeds from either step 1424 or 1412 to step 1413, in which the counter value "i" is incremented by "1" (i=5). Then, at step 1414, it is monitored whether the counter value "i" has exceeded "4". At this stage, i=5, the control proceeds from step 1414 to step 1425, in which the wafer stage 21 (see: 13) is driven downward to the given level so that the probe terminals 23A and 23B are removed from the respective electrode pads 15D and 15E (see: FIG. 3). Then, at step 1426, a stage-returning routine is executed so that the wafer stage 21 is returned to a home position.

At step 1427, an evaluation/display routine is executed so that the calculated results or positional offset amounts $\Delta dX^+$, $\Delta dX^-$, $\Delta dY^+$ and/or $\Delta dY^-$ are evaluated and displayed on the monitor 26 (see: FIG. 13), as explained in detail below with reference to FIG. 15. After the execution of the evaluation/display routine is completed, the positional offset measurement routine of FIG. 14 ends.

Figure 15:
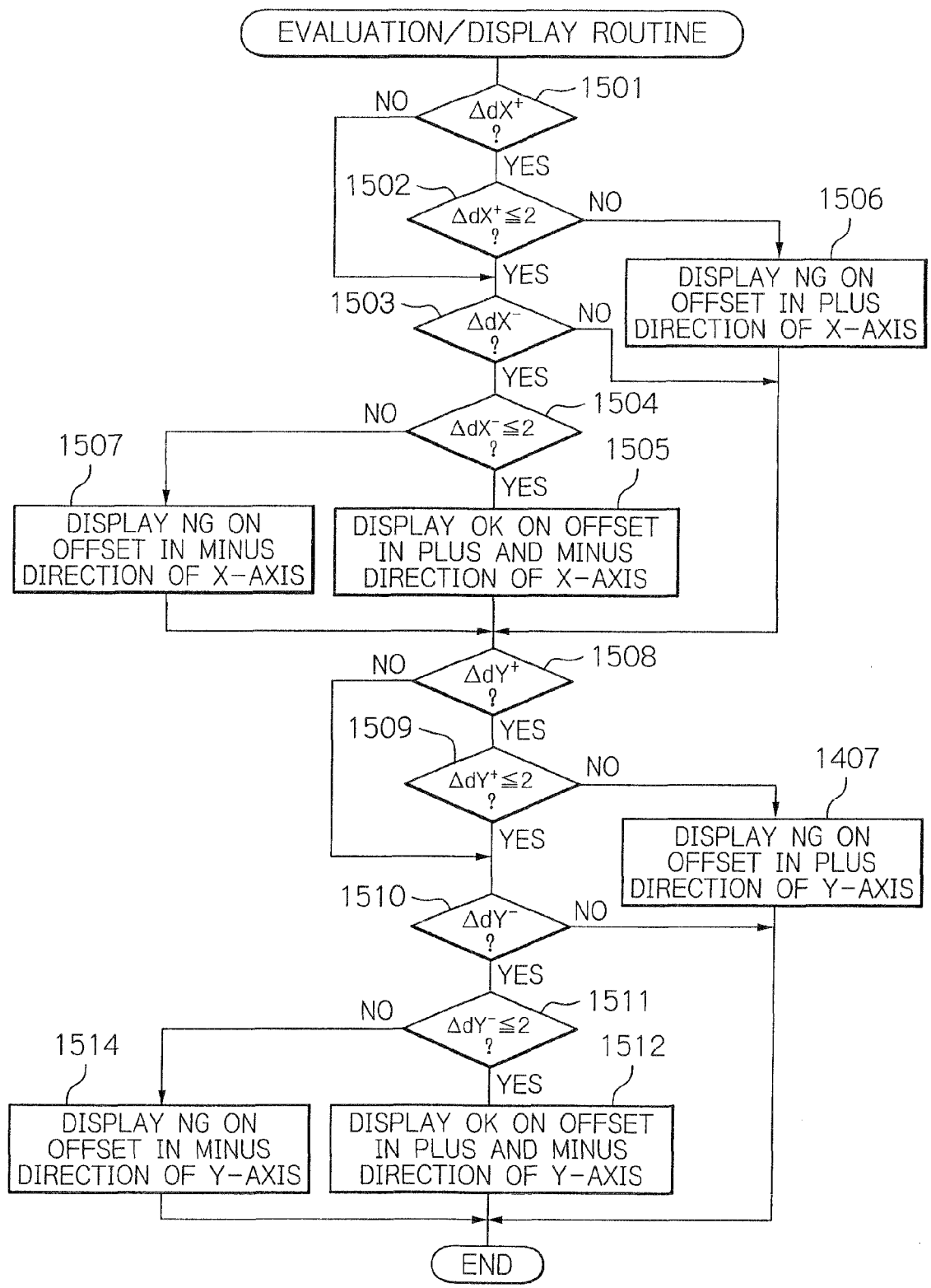
FIG. 15 is a flowchart of an evaluation/display routine executed in the positional offset measurement routine of FIG. 14.

FIG. 15 is a flowchart of the evaluation/display routine executed in step 1427 of FIG. 14.

At step 1501, it is determined whether the positional offset amount $\Delta dX^+$ has been obtained (see: step 1411). When it is confirmed that the positional offset amount $\Delta dX^+$ has been obtained, the control proceeds to step 1502, in which it is determined whether the positional offset amount $\Delta dX^+$ is equal to or less than "2".

When $\Delta dX^+ \leq 2$, the control proceeds from step 1502 to step 1503, in which it is determined whether the positional offset amount $\Delta dX^-$ has been obtained (see: step 1418). When it is confirmed that the positional offset amount $\Delta dX^-$ has been obtained, the control proceeds to step 1504, in which it is determined whether the positional offset amount $\Delta dX^-$ is equal to or less than "2".

When $\Delta dX^- \leq 2$, the control proceeds from step 1504 to step 1505, in which an OK message is displayed on the monitor 26 (see: FIG. 13) to announce that the positional offset between the arrangement of the proper via-plugs and the arrangement of the proper interconnections in both the plus and minus directions of the X-axis of the X-Y coordinate system is acceptable. At this time, preferably, the positional offsets amounts $\Delta dX^+$ and $\Delta dX^-$ are displayed together with the OK message on the monitor 26.

At step 1501, when it is confirmed that the positional offset amount $\Delta dX^+$ has not been obtained, the control skips from step 1501 to step 1503.

At step 1502, when $\Delta dX^+ > 2$, the control proceeds from step 1502 to step 1506, in which an NG message is displayed on the monitor 26 (see: FIG. 13) to announce that the positional offset between the arrangement of the proper via-plugs and the arrangement of the proper interconnections in the plus direction of the X-axis of the X-Y coordinate system is unacceptable. At this time, preferably, the positional offset amount $\Delta dX^+$ is displayed together with the NG message on the monitor 26.

At step 1503, when it is confirmed that the positional offset amount $\Delta dX^-$ has not been obtained, the control skips from step 1503 to step 1508.

At step 1504, when $\Delta dX^- > 2$, the control proceeds to from step 1504 to step 1507, in which an NG message is displayed on the monitor 26 (see: FIG. 13) to announce that the positional offset between the arrangement of the proper via-plugs and the arrangement of the proper interconnections in the minus direction of the X-axis of the X-Y coordinate system is unacceptable. At this time, preferably, the positional offset amount $\Delta dX^-$ is displayed together with the NG message on the monitor 26.

At any rate, at step 1508, it is determined whether the positional offset amount $\Delta dY^+$ has been obtained (see: step 1422). When it is confirmed that the positional offset amount $\Delta dY^+$ has been obtained, the control proceeds to step 1509, in which it is determined whether the positional offset amount $\Delta dY^+$ is equal to or less than "2".

When $\Delta dY^+ \leq 2$, the control proceeds from step 1509 to step 1510, in which it is determined whether the positional offset amount $\Delta dY^-$ has been obtained (see: step 1424). When it is confirmed that the positional offset amount $\Delta dY^-$ has been obtained, the control proceeds to step 1511, in which it is determined whether the positional offset amount $\Delta dY^-$ is equal to or less than "2".

When $\Delta dY^- \leq 2$, the control proceeds from step 1511 to step 1512, in which an OK message is displayed on the monitor 26 (see: FIG. 13) to announce that the positional offset between the arrangement of the proper via-plugs and the arrangement of the proper interconnections in both the plus and minus directions of the Y-axis of the X-Y coordinate system is acceptable. At this time, preferably, the positional offsets amounts $\Delta dY^+$ and $\Delta dY^-$ are displayed together with the OK message on the monitor 26.

At step 1508, when it is confirmed that the positional offset amount $\Delta dY^+$ has not been obtained, the control skips from step 1508 to step 1510.

At step 1509, when $\Delta dY^+ > 2$, the control proceeds from step 1509 to step 1513, in which an NG message is displayed on the monitor 26 (see: FIG. 13) to announce that the positional offset between the arrangement of the proper via-plugs and the arrangement of the proper interconnections in the plus direction of the Y-axis of the X-Y coordinate system is unacceptable. At this time, preferably, the positional offset amount $\Delta dY^-$ is displayed together with the NG message on the monitor 26.

At step 1510, when it is confirmed that the positional offset amount $\Delta dY^-$ has not been obtained, the evaluation/display routine of FIG. 15 ends.

At step 1511, when $\Delta dY^- > 2$, the control proceeds from step 1511 to step 1514, in which an NG message is displayed on the monitor 26 (see: FIG. 13) to announce that the positional offset between the arrangement of the proper via-plugs and the arrangement of the proper interconnections in the minus direction of the Y-axis of the X-Y coordinate system is unacceptable. At this time, preferably, the positional offset amount $\Delta dY^-$ is displayed together with the NG message on the monitor 26.

At any rate, the evaluation/display routine of FIG. 15 ends.

Modifications

Figure 16:
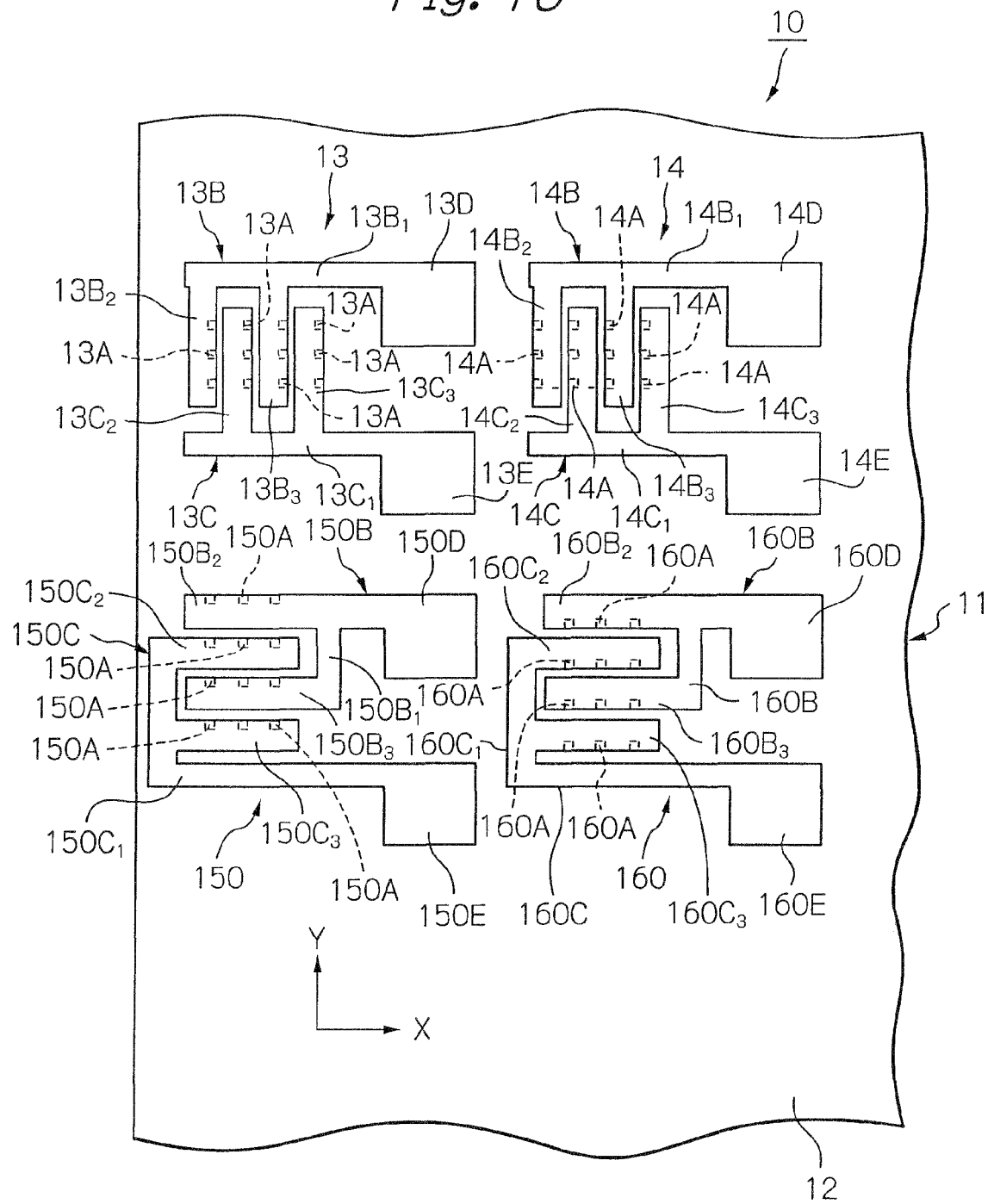
FIG. 16 is a similar partial plan view to FIG. 3, showing modifications of two of the positional offset measurement pattern units of FIG. 3.

With reference to FIG. 16 which is a similar partial plan view to FIG. 3, modifications of the positional offset measurement pattern units 15 and 16 of FIG. 3 are indicated by references 150 and 160, respectively. Namely, in FIG. 16, the positional offset measurement pattern units 150 and 160 are substituted for the positional offset measurement pattern units 15 and 16 of FIG. 3.

The positional offset measurement pattern unit 150 includes a plurality of metrical via-plugs 150A which are formed in the insulating interlayer 12 so as to be arranged in a 4×3 matrix manner at substantially the same level as the proper via-plugs. Namely, the four rows each having three metrical via-plugs 150A are arranged at the same pitch as the four columns each having the three metrical via-plugs 13A.

The positional offset measurement pattern unit 150 also includes two metrical interconnections 150B and 150C which are formed in the insulating interlayer 12 at substantially the same level as the proper interconnections. The metrical interconnection 150B has an angular section $150B_1$ extending along both the X- and Y-axes of the X-Y coordinate system, and two strip-like sections $150B_2$ and $150B_3$ integrally extending from the angular section $150B_1$ along the X-axis of the X-Y coordinate system. Similarly, the metrical interconnection 150C has an angular section $150C_1$ extending along the X- and Y-axes of the X-Y coordinate system, and two strip-like sections $150C_2$ and $150C_3$ integrally extending from the angular section $150C_1$ along the X-axis of the X-Y coordinate system.

The positional offset measurement pattern unit 150 further includes two electrode pads 150D and 150E which are formed in the insulating interlayer 12 at substantially the same level as the proper interconnections, and which are electrically connected to the angular sections $150B_1$ and $150C_1$ of the respective metrical interconnections 150B and 150C.

The metrical via-plugs 150A and the strip-like sections $150B_2, 150B_3, 150C_2$ and $150C_3$ are constituted and arranged in substantially the same manner as the metrical via-plugs 15A and the strip-like sections $15B_2, 15B_3, 15C_2$ and $15C_3$ of FIG. 3, and thus it is possible to measure a positional offset between the arrangement of the proper via-plugs and the arrangement of the proper interconnections in the plus direction of the Y-axis of the X-Y coordinate system.

The positional offset measurement pattern unit 160 includes a plurality of metrical via-plugs 160A which are formed in the insulating interlayer 12 so as to be arranged in a 4×3 matrix manner at substantially the same level as the proper via-plugs. Namely, the four rows each having three metrical via-plugs 160A are arranged at the same pitch as the four columns each having the three metrical via-plugs 13A.

The positional offset measurement pattern unit 160 also includes two metrical interconnections 160B and 160C which are formed in the insulating interlayer 12 at substantially the same level as the proper interconnections. The metrical interconnection 160B has an angular section $160B_1$ extending along both the X- and Y-axes of the X-Y coordinate system, and two strip-like sections $160B_2$ and $160B_3$ integrally extending from the angular section $160B_1$ along the X-axis of the X-Y coordinate system. Similarly, the metrical interconnection 160C has an angular section $160C_1$ extending along the X- and Y-axes of the X-Y coordinate system, and two strip-like sections $160C_2$ and $160C_3$ integrally extending from the angular section $160C_1$ along the X-axis of the X-Y coordinate system.

The positional offset measurement pattern unit 160 further includes two electrode pads 160D and 160E which are formed in the insulating interlayer 12 at substantially the same level as the proper interconnections, and which are electrically connected to the angular sections $160B_1$ and $160C_1$ of the respective metrical interconnections 160B and 160C.

The metrical via-plugs 160A and the strip-like sections $160B_2, 160B_3, 160C_2$ and $160C_3$ are constituted and arranged in substantially the same manner as the metrical via-plugs 16A and the strip-like sections $16B_2, 16B_3, 16C_2$ and $16C_3$ of FIG. 3, and thus it is possible to measure a positional offset between the arrangement of the proper via-plugs and the arrangement of the proper interconnections in the minus direction of the Y-axis of the X-Y coordinate system.

As shown in FIG. 16, since each of the plural sets of electrode pads 13D and 13E, 14D and 14E, 150D and 150E and 160D and 160E are aligned with each other along the Y-axis of the X-Y coordinate system, it is possible to carry out measurements in the positional offset measurement apparatus 20 of FIG. 13 by using the positional offset measurement pattern units 150 and 160 without rotating the wafer stage 21 around the vertical central axis thereof by the angle of +90 degrees. In other words, when the positional offset measurement pattern units 150 and 160 are used, steps 1402 and 1413 can be omitted from the positional offset measurement routine of FIG. 14.

Figure 17:
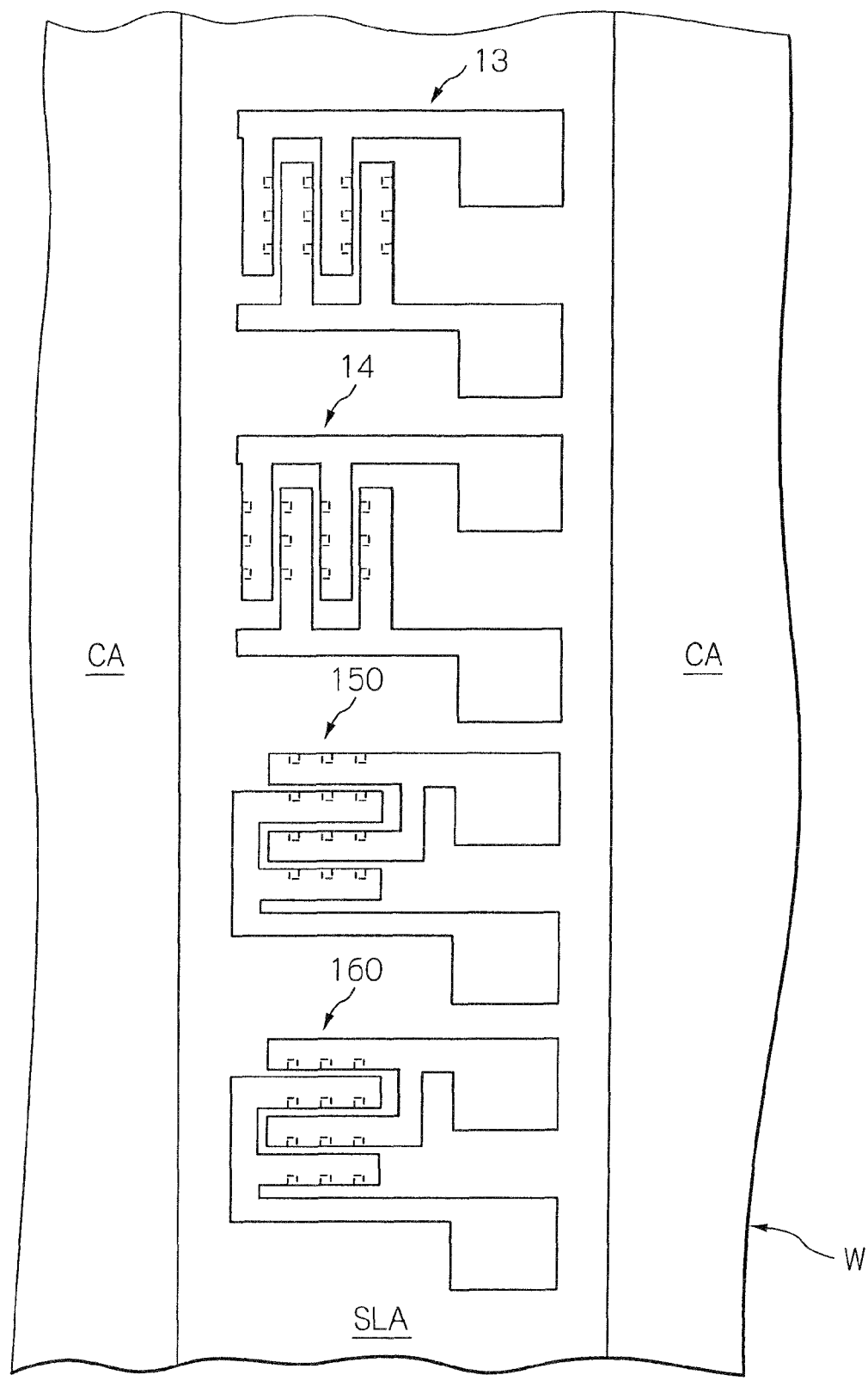
FIG. 17 is a plan view of a semiconductor wafer in which the positional offset measurement pattern units of FIG. 13 are formed in a scribe line area on the semiconductor wafer.

With reference to FIG. 17 which is a plan view of a semiconductor wafer W such as a silicon wafer, reference CA indicates chip areas in which respective semiconductor devices are produced, and reference SLA indicates a scribe line area defining the chip areas CA.

As shown in FIG. 17, when an insulating interlayer is formed over the chip areas CA on the semiconductor wafer W, and when a plurality of proper via-plugs and a plurality of proper interconnecting layers are formed in the insulating interlayer by using a dual damascene process, the four positional offset measurement pattern units 13, 14, 150 and 160 of FIG. 16 may be formed and incorporated in the scribe line area SLA. Note that the same is true for the four positional offset measurement pattern units 13, 14, 15 and 16 of FIG. 3.

Finally, it will be understood by those skilled in the art that the foregoing description is of preferred embodiments of the method, and that various changes and modifications may be made to the present invention without departing from the spirit and scope thereof.

What is claimed is:

1. A positional offset measurement pattern unit incorporated in an insulating layer, comprising:
   a first interconnection formed in said insulating layer;
   at least one first via-plug formed in said insulating layer so as to be electrically connected to said first interconnection, such that first side faces of the first interconnection and the first via-plug are coplanar and a second side face of said first interconnection extends past a second side face of the first via-plug by a first distance along a first direction;
   a second interconnection formed in said insulating layer at substantially the same level as the first interconnection so as to be spaced apart from said first interconnection by a predetermined distance; and
   at least one second via-plug formed in said insulating layer so as to be electrically connected to said second interconnection, such that first side faces of the second interconnection and the second via-plug are coplanar and a second side face of said second interconnection extends past a second side face of the second via-plug by the first distance along the first direction,
   wherein a voltage is applied between said first and second interconnections to measure a relative positional offset amount between said first via-plug and said second interconnection, and
   wherein said second side face of said second interconnection is spaced apart from said coplanar first side faces of said first interconnection and the first via-plug by said predetermined distance that is less than the first distance.

2. The positional offset measurement pattern unit as set forth in claim 1, wherein said at least one first via-plug is arranged so as to confront the second side face of said second interconnection which is opposed to the first side face of said first interconnection.

3. The positional offset measurement pattern unit as set forth in claim 2, wherein said at least one via-plug has a side face which is coplanar with the side face of said first interconnection when said at least one via-plug and said second interconnection are correctly arranged with respect to each other.

4. The positional offset measurement pattern unit as set forth in claim 1, wherein said at least one first via-plug has a size smaller than a width of said first interconnection.

5. The positional offset measurement pattern unit as set forth in claim 1, wherein said at least one via-plug has a square cross section, and wherein a side length of said at least one via-plug is substantially equal to said predetermined distance between said first and second interconnections.

6. The positional offset measurement pattern unit as set forth in claim 1, wherein said respective first and second interconnections include electrode terminals for applying said voltage therebetween.

7. The positional offset measurement pattern unit as set forth in claim 1, wherein said respective first and second interconnections include a plurality of first strip-like sections and a plurality of second strip-like sections, said first and second strip-like sections being alternately arranged so as to be spaced from each other by said predetermined distance.

8. The positional offset measurement pattern unit as set forth in claim 7, further comprising a plurality of the at least one first via-plugs and a plurality of the at least one second via-plugs formed in said insulating layer, wherein said first strip-like sections are electrically connected to said plurality of the at least one first via-plugs, respectively, and wherein said second strip-like sections are electrically connected to said plurality of the at least one second via-plugs, respectively.

9. The positional offset measurement pattern unit as set forth in claim 8, wherein each of said plurality of the first via-plugs, which are electrically connected to said respective first strip-like sections, are arranged so as to confront the second side faces of said second strip-like sections which are opposed to the first side faces of said respective first strip-like sections.

10. The positional offset measurement pattern unit as set forth in claim 9, wherein each of said first via-plugs has a side face which is coplanar with the side face of the corresponding first strip-like section when said first via-plugs are correctly arranged with respect to said second interconnection, and wherein each of said second via-plugs has a side face which is coplanar with the side face of the corresponding second strip-like section when said second via-plugs are correctly arranged with respect to said first interconnection.

11. The positional offset measurement pattern unit as set forth in claim 1, wherein said at least one first via-plug, said first interconnection, said at least one second via-plug, and said second interconnection are simultaneously formed by using a dual damascene process.

12. A method for measuring a positional offset amount, by using a positional offset measurement pattern unit as set forth in claim 1, which method comprises:
   applying a voltage between said first and second interconnections; and
   gradually stepping up said voltage until a breakdown occurs between said at least one via-plug and said second interconnection.

13. The method as set forth in claim 12, further comprising:
   determining a last stepped-up voltage at which said breakdown voltage has occurred; and
   calculating a distance between said at least one via-plug and said second interconnection based on said last stepped-up voltage.

14. The method as set forth in claim 13, further comprising:
   determining a last stepped-up voltage at which said breakdown voltage has occurred; and
   calculating a distance between said at least one via-plug and said second interconnection based on said last stepped-up voltage.

15. The method as set forth in claim 14, further comprising:
   determining whether said calculated distance falls within a permissible range; and
   determining that the positional offset amount between said at least one via-plugs and said second interconnections is acceptable when said calculated distance falls within a permissible range.

16. The method as set forth in claim 14, further comprising:
   determining whether said calculated distance falls within a permissible range; and
   determining that the positional offset amount between said at least one via-plugs and said second interconnections is unacceptable when said calculated distance departs from a permissible range.

* * * * *